(12) United States Patent
Maejima et al.

(10) Patent No.: US 11,538,791 B2
(45) Date of Patent: Dec. 27, 2022

(54) SEMICONDUCTOR MEMORY DEVICE INCLUDING A MEMORY CHIP AND A CIRCUIT CHIP BONDED TO THE MEMORY CHIP

(71) Applicant: KIOXIA CORPORATION, Tokyo (JP)

(72) Inventors: Hiroshi Maejima, Setagaya Tokyo (JP); Toshifumi Hashimoto, Fujisawa Kanagawa (JP); Takashi Maeda, Kamakura Kanagawa (JP); Masumi Saitoh, Yokohama Kanagawa (JP); Tetsuaki Utsumi, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 75 days.

(21) Appl. No.: 16/802,462

(22) Filed: Feb. 26, 2020

(65) Prior Publication Data
US 2020/0395341 A1 Dec. 17, 2020

(30) Foreign Application Priority Data
Jun. 14, 2019 (JP) .............................. JP2019-111045

(51) Int. Cl.
| H01L 25/065 | (2006.01) |
| H01L 25/18 | (2006.01) |
| H01L 23/00 | (2006.01) |

(52) U.S. Cl.
CPC .......... *H01L 25/0657* (2013.01); *H01L 24/08* (2013.01); *H01L 25/18* (2013.01); *H01L 2224/08145* (2013.01); *H01L 2225/06524* (2013.01); *H01L 2924/1431* (2013.01); *H01L 2924/14511* (2013.01)

(58) Field of Classification Search
CPC ............................ H01L 25/0657; H01L 25/18
See application file for complete search history.

(56) References Cited

U.S. PATENT DOCUMENTS

| 9,412,749 | B1 | 8/2016 | Shimabukuro et al. |
| 9,716,137 | B1 * | 7/2017 | Hu .................... H01L 27/11582 |
| 10,354,987 | B1 * | 7/2019 | Mushiga ........... H01L 21/76898 |

(Continued)

FOREIGN PATENT DOCUMENTS

| JP | 2018-148071 A | 9/2018 |
| WO | 2016043990 A1 | 3/2016 |

*Primary Examiner* — Michael Jung
(74) *Attorney, Agent, or Firm* — Kim & Stewart LLP

(57) ABSTRACT

A semiconductor memory device includes a memory chip. The memory chip includes a first region including a plurality of first memory cells and second memory cells, a second region different from the first region, a plurality of first word lines stacked apart from each other in a first direction in the first and second regions, a first pillar including a first semiconductor layer extending through the first word lines, and a first insulator layer provided between the first semiconductor layer and the first word lines, in the first region, the first memory cells being located at intersections of the first pillar with the first word lines, a first bonding pad in the second region, and a first transistor between the first word lines and the first bonding pad, and connected between one of the first word lines and the first bonding pad, in the second region.

17 Claims, 23 Drawing Sheets

(56) References Cited

U.S. PATENT DOCUMENTS

| | | |
|---|---|---|
| 10,665,581 B1 * | 5/2020 | Zhou ..................... H01L 24/11 |
| 2018/0261575 A1 | 9/2018 | Tagami et al. |
| 2019/0081069 A1 | 3/2019 | Lu et al. |
| 2020/0251443 A1 * | 8/2020 | Kanakamedala ....... H01L 24/94 |

* cited by examiner

COMPARATIVE EXAMPLE OF FIFTH EMBODIMENT

FIG. 27
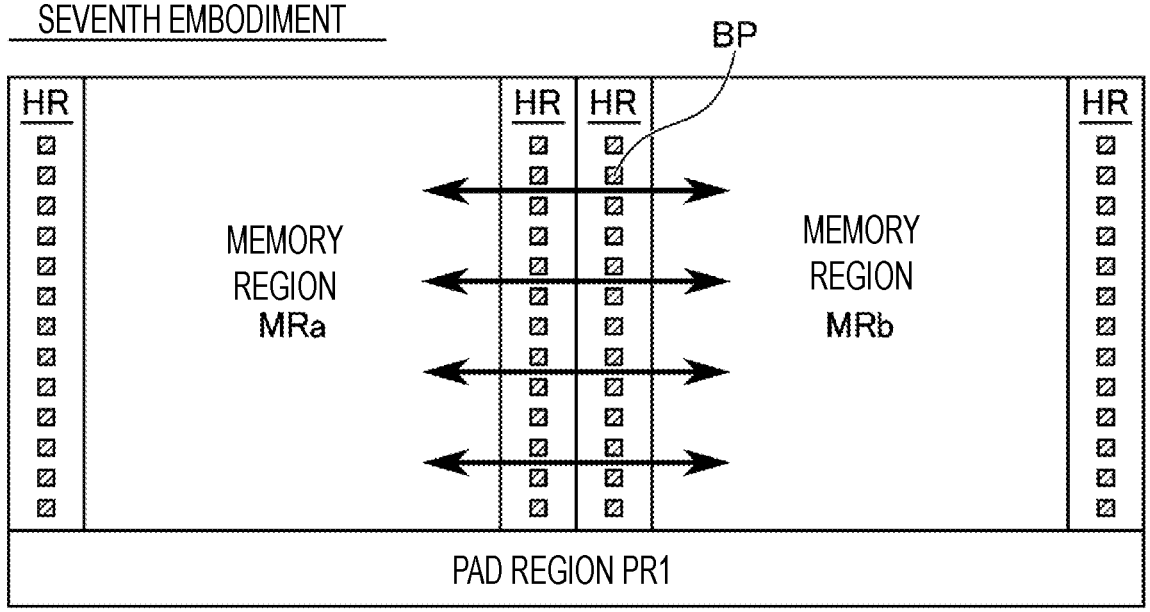
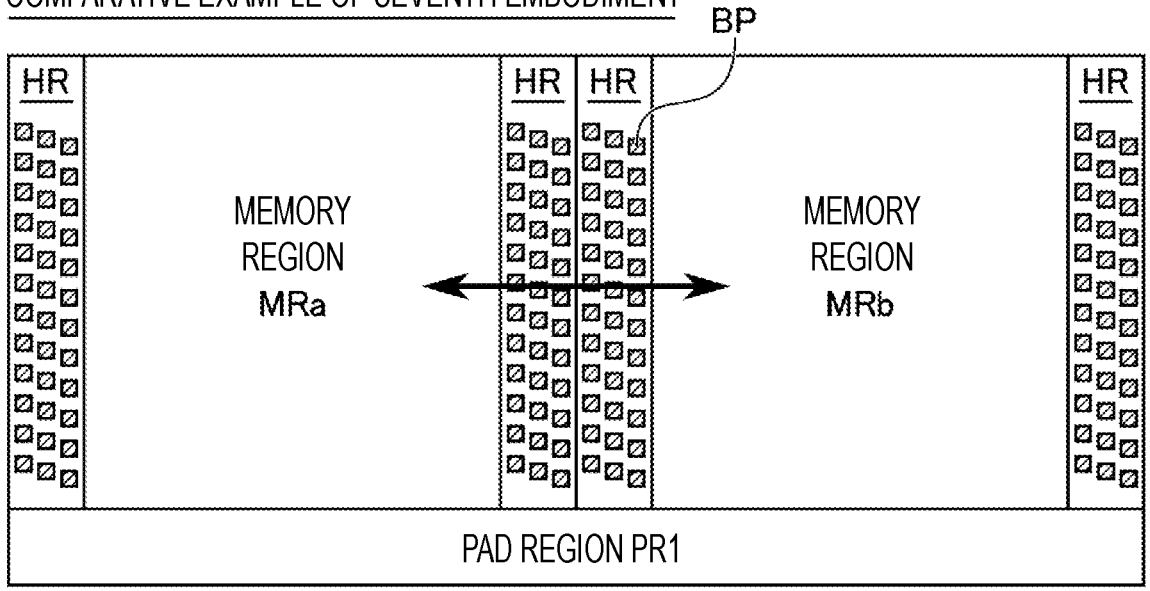

SEMICONDUCTOR MEMORY DEVICE INCLUDING A MEMORY CHIP AND A CIRCUIT CHIP BONDED TO THE MEMORY CHIP

CROSS-REFERENCE TO RELATED APPLICATION(S)

This application is based upon and claims the benefit of priority from Japanese Patent Application No. 2019-111045, filed on Jun. 14, 2019, the entire contents of which are incorporated herein by reference.

FIELD

Embodiments described herein relate generally to a semiconductor memory device.

BACKGROUND

A NAND-type flash memory capable of storing data in a non-volatile manner is known.

DESCRIPTION OF THE DRAWINGS

FIG. 27 is a plan view illustrating an image of wirings between planes in each of the seventh embodiment and a comparative example of the seventh embodiment.

DETAILED DESCRIPTION

Figure 1:
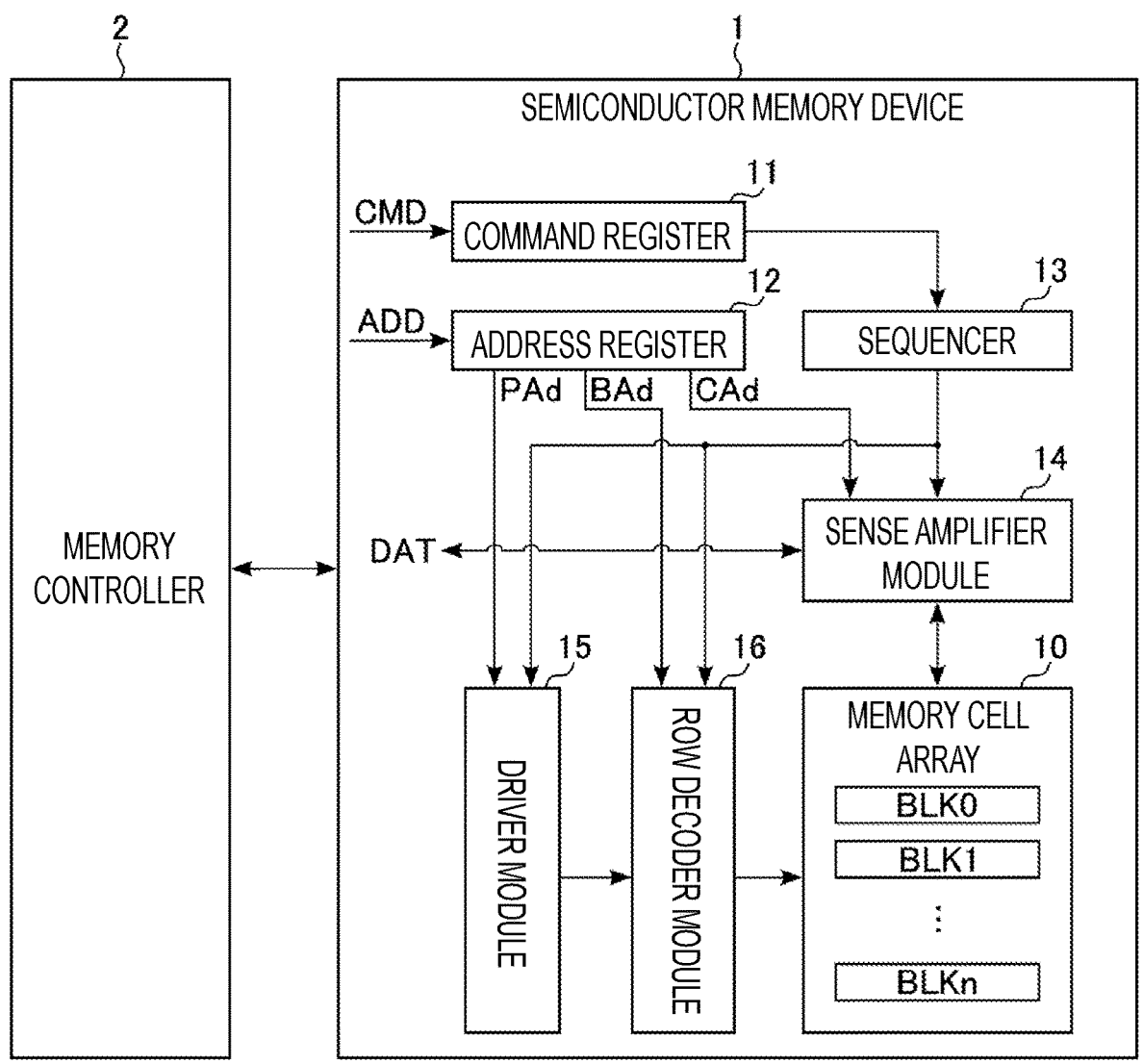
FIG. 1 is a block diagram illustrating an example of a configuration of a semiconductor memory device according to a first embodiment.

The reliability of data to be stored in the semiconductor memory device is improved in the embodiments.

In general, according to one embodiment, a semiconductor memory device includes a memory chip. The memory chip includes a first region including a plurality of first memory cells and second memory cells, a second region different from the first region, a plurality of first word lines stacked apart from each other in a first direction in the first region and the second region, a first pillar including a first semiconductor layer extending through the plurality of first word lines, and a first insulator layer provided between the first semiconductor layer and the plurality of first word lines, in the first region, the first memory cells being located at intersections of the first pillar with the first word lines, a first bonding pad in the second region, and a first transistor between the plurality of first word lines and the first bonding pad, and connected between one of the first word lines and the first bonding pad, in the second region.

Hereinafter, embodiments will be described with reference to the accompanying drawings. Each embodiment is an example of an apparatus or a method for embodying the technical idea of the present disclosure. The drawings are schematic or conceptual, and the dimensions, ratios, etc., of the drawings may not necessarily be the same as actual dimensions, ratios, etc. The technical idea of the present disclosure is not limited by shapes, structures, arrangements, etc., of components.

In the following description, components having a substantially similar function or configuration will be denoted by the same reference numeral. Numerals followed by a character to make up a reference numeral are referred to by the reference numeral including the same character, and are used to distinguish components having a similar configuration from each other. When it is unnecessary to distinguish components indicated by reference numerals including the same character, each of the components will be referred to by the reference numeral including only the character.

[1] First Embodiment

Hereinafter, a semiconductor memory device 1 according to a first embodiment will be described.

[1-1] Configuration of Semiconductor Memory Device 1

[1-1-1] Overall Configuration of Semiconductor Memory Device 1

FIG. 1 illustrates an example of a configuration of the semiconductor memory device 1 according to the first embodiment. The semiconductor memory device 1 is a NAND-type flash memory capable of storing data in a non-volatile manner, and is controlled by an external memory controller 2. The communication between the semiconductor memory device 1 and the memory controller 2 supports, for example, a NAND interface standard.

As illustrated in FIG. 1, the semiconductor memory device 1 includes, for example, a memory cell array 10, a command register 11, an address register 12, a sequencer 13, a sense amplifier module 14, a driver module 15, and a row decoder module 16.

The memory cell array 10 includes a plurality of blocks BLK0 to BLKn (n is an integer of 1 or more). The block BLK is a set of a plurality of memory cells capable of storing data in a non-volatile manner, and is used as, for example, a data erase unit. In the memory cell array 10, a plurality of bit lines and a plurality of word lines are provided. Each memory cell is associated with, for example, one bit line and one word line. A detailed configuration of the memory cell array 10 will be described below.

The command register 11 stores a command CMD received by the semiconductor memory device 1 from the memory controller 2. The command CMD includes, for example, a command for causing the sequencer 13 to execute a read operation, a write operation, an erase operation, etc.

The address register 12 stores address information ADD received by the semiconductor memory device 1 from the memory controller 2. The address information ADD includes, for example, a block address BAd, a page address PAd, and a column address CAd. For example, the block address BAd, the page address PAd, and the column address CAd are used for selecting a block BLK, a word line, and a bit line, respectively.

The sequencer 13 controls the overall operation of the semiconductor memory device 1. For example, the sequencer 13 controls the sense amplifier module 14, the driver module 15, the row decoder module 16, etc., on the basis of the command CMD stored in the command register 11, so as to execute a read operation, a write operation, an erase operation, etc.

In a write operation, the sense amplifier module 14 applies a desired voltage to each bit line according to write data DAT received from the memory controller 2. In a read operation, the sense amplifier module 14 determines data stored in a memory cell on the basis of the voltage of the bit line, and transmits the determination result as read data DAT to the memory controller 2.

The driver module 15 generates a voltage used for a read operation, a write operation, an erase operation, etc. Then, for example, the driver module 15 applies the generated voltage to a signal line corresponding to a selected word line on the basis of the page address PAd stored in the address register 12.

The row decoder module 16 selects one block BLK in the corresponding memory cell array 10 on the basis of the block address BAd stored in the address register 12. Then, for example, the row decoder module 16 transmits the voltage applied to the signal line corresponding to the selected word line, to the selected word line in the selected block BLK.

The combination of the semiconductor memory device 1 and the memory controller 2 described above may be a single semiconductor device. The semiconductor device may be, for example, a memory card such as an SD™ card, a solid state drive (SSD) or the like.

[1-1-2] Circuit Configuration of Semiconductor Memory Device 1

(Circuit Configuration of Memory Cell Array 10)

Figure 2:
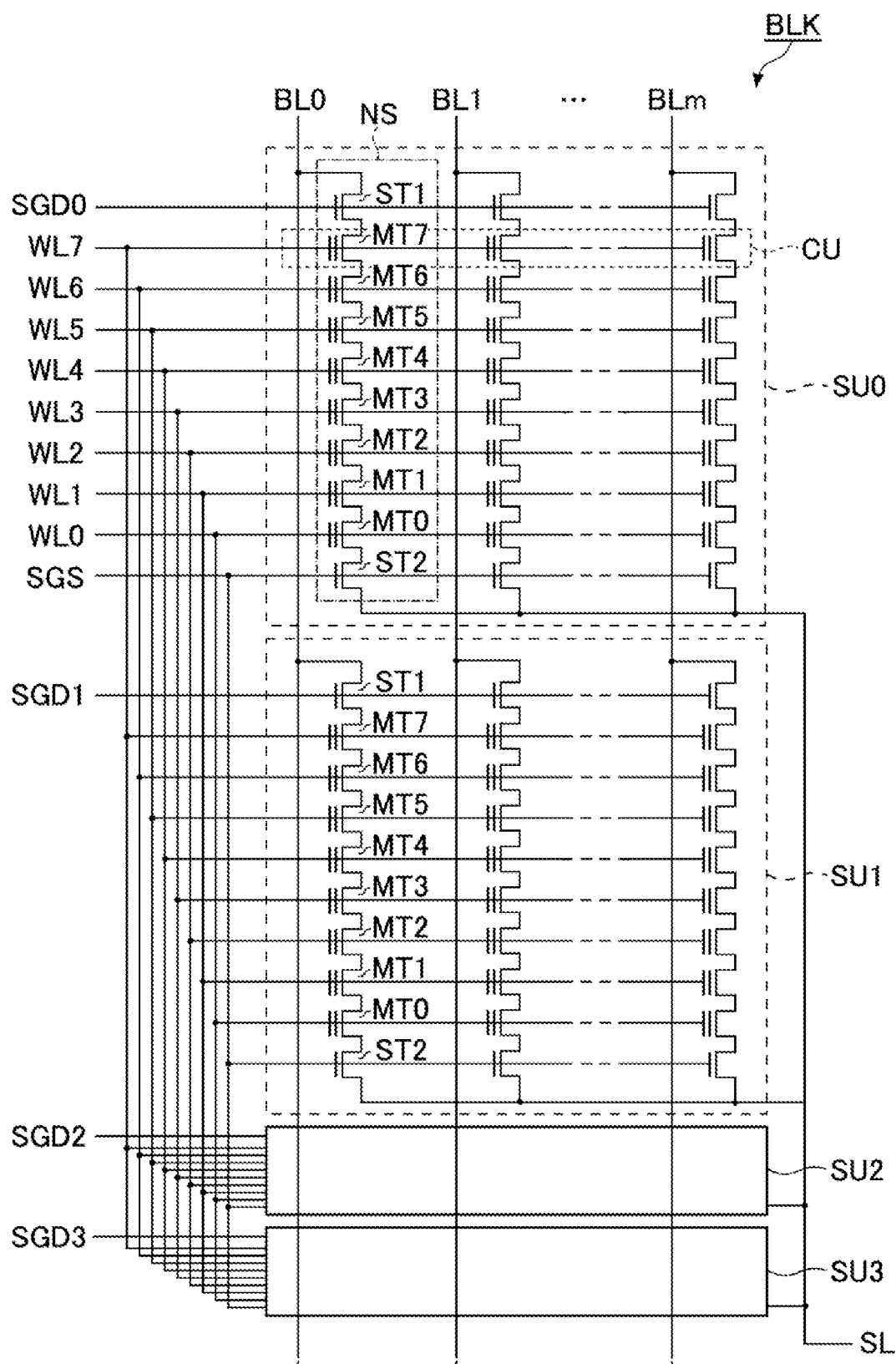
FIG. 2 is a circuit diagram illustrating an example of a circuit configuration of a memory cell array in the semiconductor memory device according to the first embodiment.

FIG. 2 illustrates an example of a circuit configuration of one block of the memory cell array 10 in the semiconductor memory device 1 according to the first embodiment. As illustrated in FIG. 2, the block BLK includes, for example, four string units SU0 to SU3.

Each string unit SU includes a plurality of NAND strings NS that are associated with bit lines BL0 to BLm (m is an integer greater than or equal to 1), respectively. Each NAND string NS includes, for example, memory cell transistors MT0 to MT7, and select transistors ST1 and ST2. The memory cell transistor MT includes a control gate and a charge storage layer, and stores data in a non-volatile manner. Each of the select transistors ST1 and ST2 is used for a selection of a string unit SU at the time of various operations.

In each NAND string NS, the memory cell transistors MT0 to MT7 are connected to each other in series. The drain of the select transistor ST1 is connected to the associated bit line BL, and the source of the select transistor ST1 is connected to one end of the memory cell transistors MT0 to MT7 which are connected to each other in series. The drain of the select transistor ST2 is connected to the other end of the memory cell transistors MT0 to MT7. The source of the select transistor ST2 is connected to a source line SL.

In the same block BLK, the control gates of the memory cell transistors MT0 to MT7 of different string units are connected in common to word lines WL0 to WL7, respectively. The gates of the select transistors ST1 in the string units SU0 to SU3 are connected in common to select gate lines SGD0 to SGD3, respectively. The gates of the select transistors ST2 are connected in common to a select gate line SGS.

In the above-described circuit configuration of the memory cell array 10, the bit line BL is shared by NAND strings NS to which the same column address is allocated, in the respective string units SU. The source line SL is shared among, for example, the plurality of blocks BLK.

A set of a plurality of memory cell transistors MT connected to the common word line WL in one string unit SU will be referred to as, for example, a cell unit CU. For example, the storage capacity of the cell unit CU that includes the memory cell transistors MT each storing 1-bit data is defined as "one page data." The cell unit CU may have a storage capacity of two or more pages of data according to the number of bits of data stored in the memory cell transistor MT.

In addition, the circuit configuration of the memory cell array 10 in the semiconductor memory device 1 according to the first embodiment is not limited to the above-described circuit configuration. For example, the numbers of the memory cell transistors MT and the select transistors ST1 and ST2 which are provided in each NAND string NS is a design parameter. The number of the string units SU in each block BLK is also a design parameter.

(Circuit Configuration of Sense Amplifier Module 14)

Figure 3:
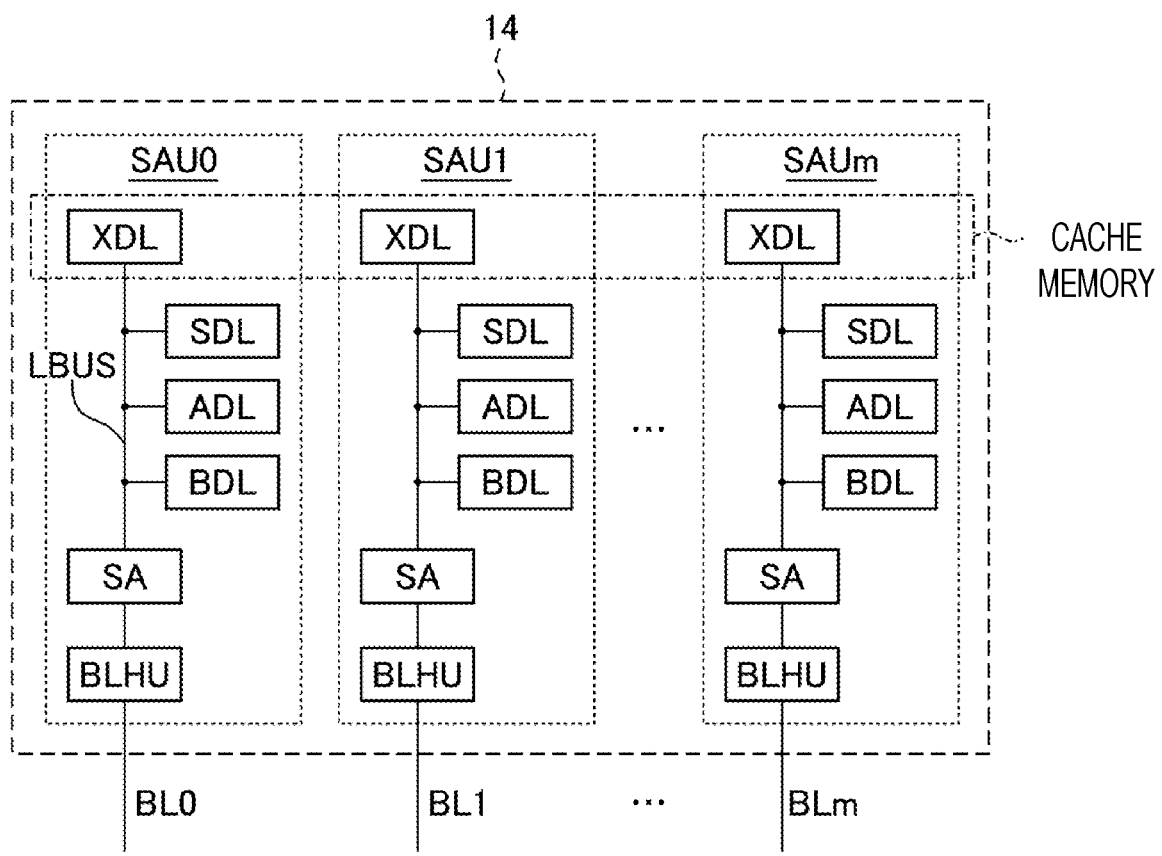
FIG. 3 is a circuit diagram illustrating an example of a circuit configuration of a sense amplifier module in the semiconductor memory device according to the first embodiment.

FIG. 3 illustrates an example of a circuit configuration of the sense amplifier module 14 in the semiconductor memory device 1 according to the first embodiment. As illustrated in FIG. 3, the sense amplifier module 14 includes, for example, sense amplifier units SAU0 to SAUm. The sense amplifier units SAU0 to SAUm are associated with the bit lines BL0 to BLm, respectively. Each sense amplifier unit SAU includes, for example, a bit line connector BLHU, a sense amplifier SA, a bus LBUS, and latch circuits SDL, ADL, BDL and XDL.

The bit line connector BLHU is connected between the associated bit line BL, and the sense amplifier SA. For example, in the read operation, the sense amplifier SA determines whether read data is "0" or "1" on the basis of a voltage of the associated bit line BL. That is, the sense amplifier SA senses data read from the associated bit line BL and determines data that is stored in a selected memory cell. Each of the latch circuits SDL, ADL, BDL and XDL temporarily stores read data, write data, etc.

The sense amplifier SA, and the latch circuits SDL, ADL, BDL and XDL are connected to the bus LBUS, and are capable of transmitting/receiving data to/from each other via the bus LBUS. The latch circuit XDL is connected to an input/output circuit (not illustrated), and used for data input/output between the sense amplifier unit SAU and the input/output circuit. The latch circuit XDL may also be used as, for example, a cache memory of the semiconductor memory device 1. For example, the semiconductor memory device 1 may go into the ready state when the latch circuit XDL is vacant, even though the latch circuits SDL, ADL and BDL are being used.

Figure 4:
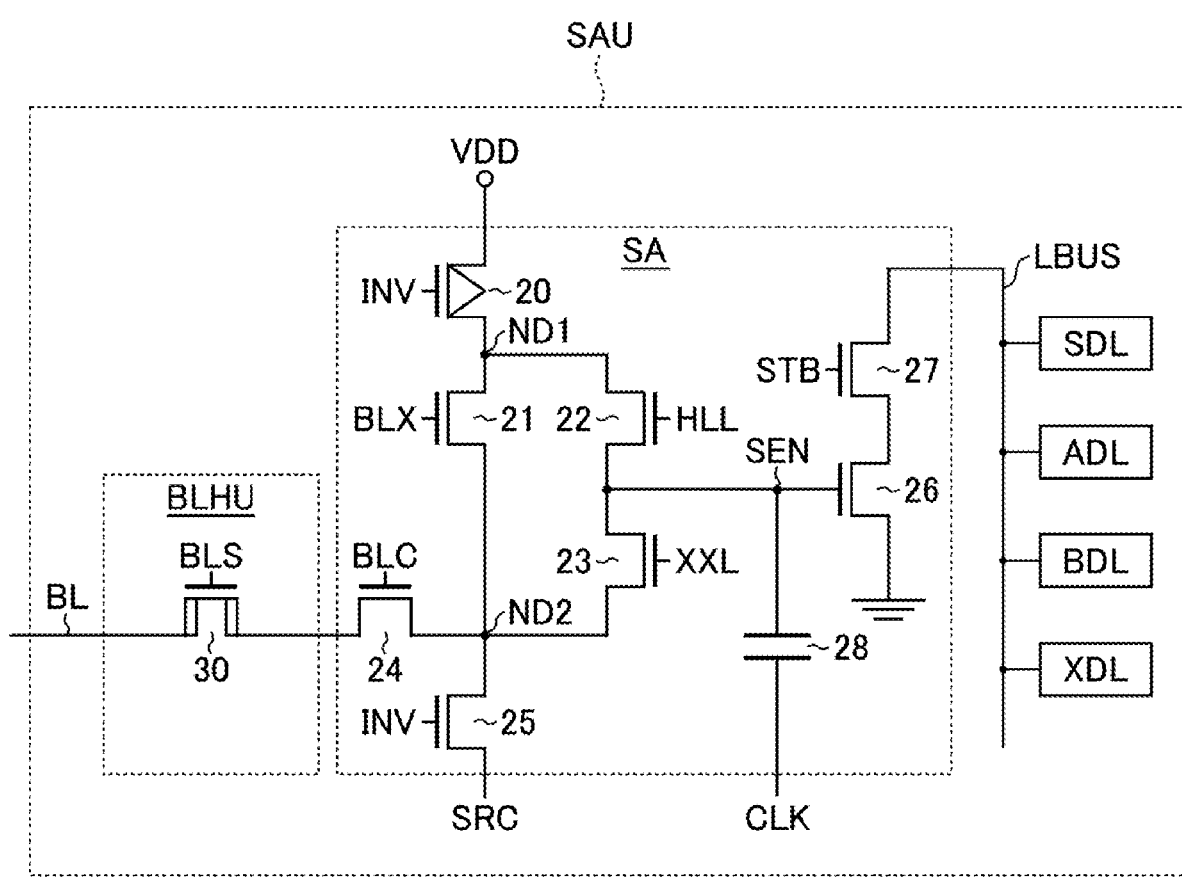
FIG. 4 is a circuit diagram illustrating an example of a circuit configuration of a sense amplifier unit in the semiconductor memory device according to the first embodiment.

FIG. 4 illustrates an example of a circuit configuration of the sense amplifier unit SAU in the semiconductor memory device 1 according to the first embodiment. As illustrated in FIG. 4, for example, the sense amplifier SA includes transistors 20 to 27 and a capacitor 28, and the bit line connector BLHU includes a transistor 30.

The transistor 20 is a P-type MOS transistor. Each of the transistors 21 to 27 is an N-type MOS transistor. The transistor 30 is an N-type MOS transistor having a higher breakdown voltage than each of the transistors 20 to 27. Hereinafter, the transistors 20 to 27 are also referred to as low breakdown voltage transistors, and the transistor is also referred to as a high breakdown voltage transistor.

The source of the transistor 20 is connected to a power line. The drain of the transistor 20 is connected to a node ND1. The gate of the transistor 20 is connected to, for example, a node INV in the latch circuit SDL. The drain of the transistor 21 is connected to the node ND1. The source of the transistor 21 is connected to a node ND2. A control signal BLX is input to the gate of the transistor 21. The drain of the transistor 22 is connected to the node ND1. The source of the transistor 22 is connected to a node SEN. A control signal HLL is input to the gate of the transistor 22.

The drain of the transistor 23 is connected to the node SEN. The source of the transistor 23 is connected to the node ND2. A control signal XXL is input to the gate of the transistor 23. The drain of the transistor 24 is connected to the node ND2. A control signal BLC is input to the gate of the transistor 24. The drain of the transistor 25 is connected to the node ND2. The source of the transistor 25 is connected to a node SRC. The gate of the transistor 25 is connected to, for example, the node INV in the latch circuit SDL.

The source of the transistor 26 is grounded. The gate of the transistor 26 is connected to the node SEN. The drain of the transistor 27 is connected to the bus LBUS. The source of the transistor 27 is connected to the drain of the transistor 26. A control signal STB is input to the gate of the transistor 27. One electrode of the capacitor 28 is connected to the node SEN. A clock CLK is input to the other electrode of the capacitor 28.

The drain of the transistor 30 is connected to the source of the transistor 24. The source of the transistor 30 is connected to the bit line BL. A control signal BLS is input to the gate of the transistor 30.

In the above-described circuit configuration of the sense amplifier unit SAU, for example, a power supply voltage VDD is applied to the power line connected to the source of the transistor 20. For example, a ground voltage VSS is applied to the node SRC. Each of the control signals BLX, HLL, XXL, BLC, STB, and BLS, and the clock CLK is generated by, for example, the sequencer 13. The sense amplifier SA determines data read to the bit line BL on the basis of, for example, the timing when the control signal STB is asserted.

In addition, the sense amplifier module 14 in the semiconductor memory device 1 according to the first embodiment is not limited to the above-described circuit configuration. For example, the number of latch circuits in each sense amplifier unit SAU may be appropriately changed on the basis of the number of pages to be stored in one cell unit CU. The sense amplifier SA may have another circuit configuration as long as it is possible to determine data read to the bit line BL.

(Circuit Configuration of Row Decoder Module 16)

Figure 5:
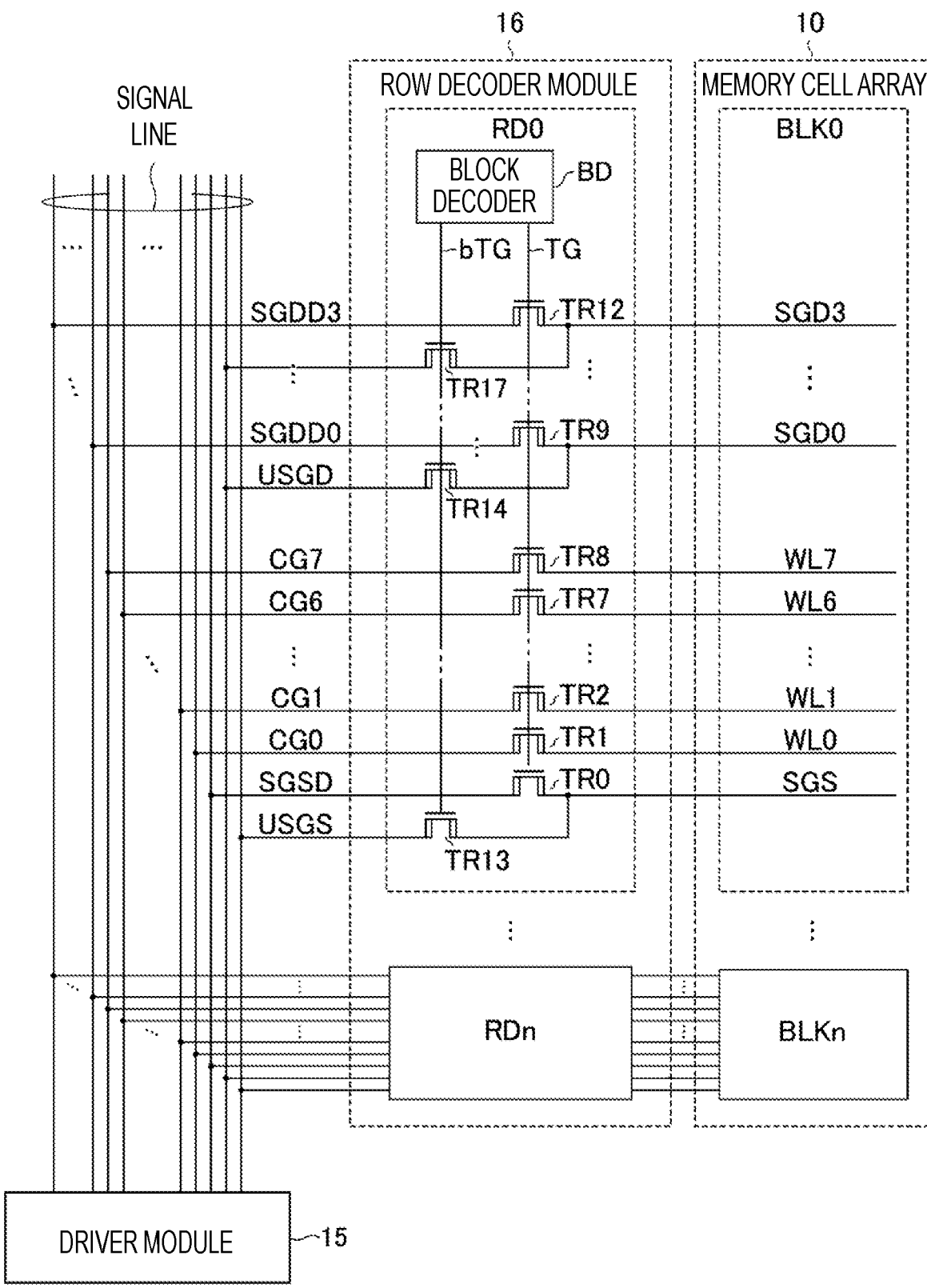
FIG. 5 is a circuit diagram illustrating an example of a circuit configuration of a row decoder module in the semiconductor memory device according to the first embodiment.

FIG. 5 illustrates an example of a circuit configuration of the row decoder module 16 in the semiconductor memory device 1 according to the first embodiment. As illustrated in FIG. 5, the row decoder module 16 is connected to the driver module 15 via, for example, signal lines CG0 to CG7, SGDD0 to SGDD3, SGSD, USGD, and USGS.

Hereinafter, descriptions will be made on a detailed circuit configuration of a row decoder RD, focusing on a row decoder RD0 corresponding to the block BLK0. The row decoder RD includes, for example, a block decoder BD, transfer gate lines TG and bTG, and transistors TR0 to TR17.

The block decoder BD decodes a block address BAd. Then, the block decoder BD applies a predetermined voltage to each of the transfer gate lines TG and bTG on the basis of the decoding result. The voltage applied to the transfer gate line TG and the voltage applied to the transfer gate line bTG have a complementary relationship. That is, an inverted signal of the transfer gate line TG is input to the transfer gate line TGb.

Each of the transistors TR0 to TR17 is an N-type MOS transistor with a high breakdown voltage. The gates of the transistors TR0 to TR12 are connected in common to the transfer gate line TG. The gates of the transistors TR13 to TR17 are connected in common to the transfer gate line bTG. Each transistor TR is connected between the signal line wired from the driver module 15, and the wiring provided in the corresponding block BLK.

Specifically, the drain of the transistor TR0 is connected to the signal line SGSD. The source of the transistor TR0 is connected to the select gate line SGS. The drains of the transistors TR1 to TR8 are connected to the signal lines CG0 to CG7, respectively. The sources of the transistors TR1 to TR8 are connected to the word lines WL0 to WL7, respectively. The drains of the transistors TR9 to TR12 are connected to the signal lines SGDD0 to SGDD3, respectively. The sources of the transistors TR9 to TR12 are connected to the select gate lines SGD0 to SGD3, respectively. The drain of the transistor TR13 is connected to the signal line USGS. The source of the transistor TR13 is connected to the select gate line SGS. The drains of the transistors TR14 to TR17 are connected in common to the signal line USGD. The sources of the transistors TR14 to TR17 are connected to the select gate lines SGD0 to SGD3, respectively.

Through the above configuration, the row decoder module 16 is able to select the block BLK. Specifically, in various operations, the block decoder BD corresponding to a selected block BLK applies voltages with an "H" level and an "L" level to the transfer gate lines TG and bTG, respectively, and the block decoder BD corresponding to a non-selected block BLK applies voltages with an "L" level and an "H" level to the transfer gate lines TG and bTG, respectively.

In addition, the above-described circuit configuration of the row decoder module 16 is merely an example, and may be appropriately changed. For example, the number of transistors TR in the row decoder module 16 may be designed based on the number of wirings provided in each block BLK.

[1-1-3] Structure of Semiconductor Memory Device 1

Hereinafter, an example of the structure of the semiconductor memory device 1 according to the first embodiment will be described. In the drawings to be referred-to herein below, the X direction corresponds to the extending direction of a word line WL, the Y direction corresponds to the extending direction of a bit line BL, and the Z direction corresponds to a direction perpendicular to the surface of a semiconductor substrate on which the semiconductor memory device 1 is formed. In a plan view, hatching is appropriately added for easy viewing of the drawing. The hatching added to the plan view is not necessarily related to a material or characteristic of a component to which the hatching is added. In the drawings to be referred-to herein, the illustration of components such as wirings and contacts is appropriately omitted for easy viewing of the drawings.

(Overall Structure of Semiconductor Memory Device 1)

Figure 6:
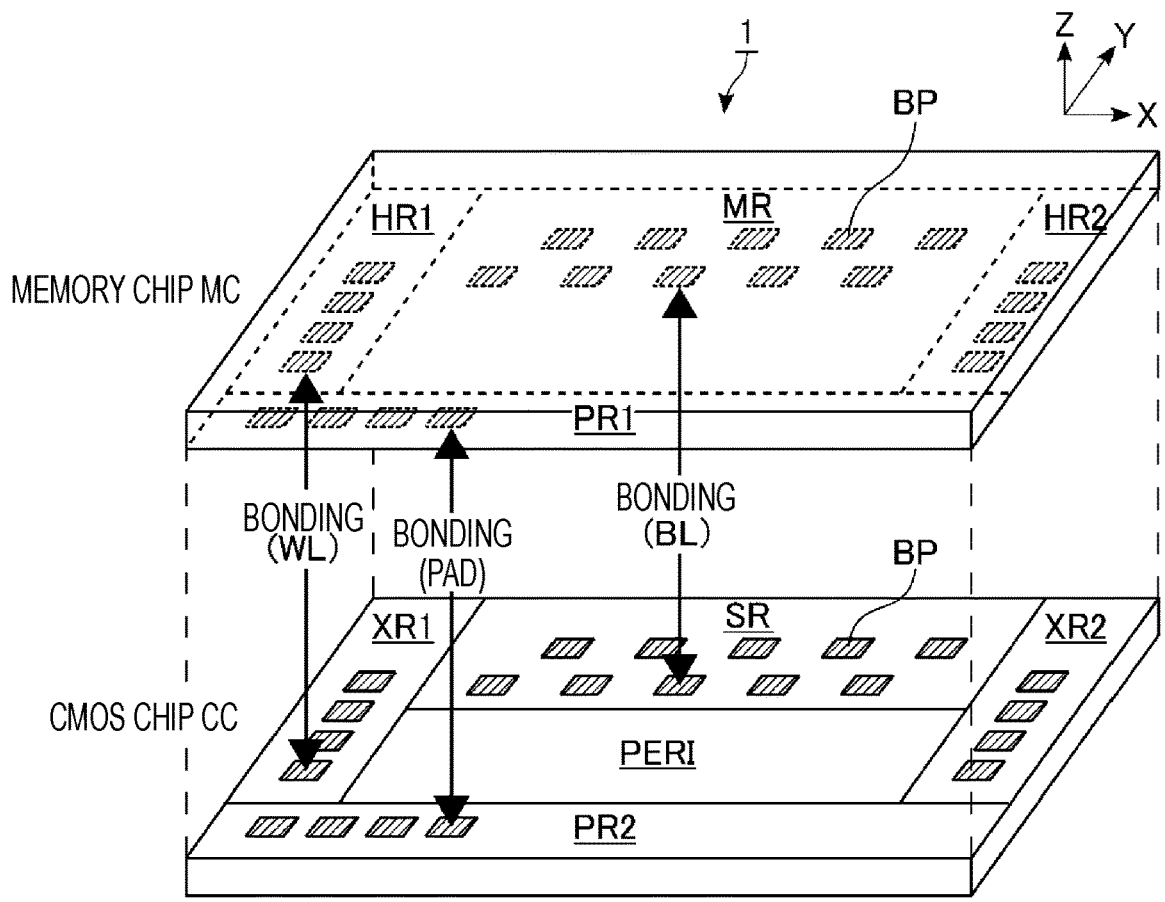
FIG. 6 is a perspective view illustrating an example of a structure of the semiconductor memory device according to the first embodiment.

FIG. 6 illustrates an example of an overall structure of the semiconductor memory device 1 according to the first embodiment. As illustrated in FIG. 6, the semiconductor memory device 1 includes a memory chip MC and a CMOS chip CC, and has a structure in which the lower surface of the memory chip MC and the upper surface of the CMOS chip CC are bonded. According to the directions illustrated in FIG. 6, the memory chip MC is disposed at one side in the Z direction with respect to the CMOS chip CC, and the CMOS chip CC is disposed at the other side in the Z direction with respect to the memory chip MC. In other words, the memory chip MC is disposed above the CMOS chip CC, and the CMOS chip CC is disposed below the memory chip MC. On the other hand, the directions may be explained such that "above" and "below" is consistent with illustration of the concerned drawing. The memory chip MC includes, for example, a structure corresponding to the memory cell array 10, and a part of a structure corresponding to the row decoder module 16. The CMOS chip CC includes, for example, a structure corresponding to the sequencer 13, the command register 11, the address register 12, the sequencer 13, the sense amplifier module 14, and the driver module 15, and a part of a structure corresponding to the row decoder module 16.

A region of the memory chip MC is divided into, for example, a memory region MR, lead regions HR1 and HR2, and a pad region PR1. NAND strings NS are provided in the memory region MR. The memory region MR is interposed between, for example, the lead regions HR1 and HR2 in the X direction. In the lead regions HR1 and HR2, a part (e.g., the transistors TR) of circuits corresponding to the row decoder module 16 is provided. The pad region PR1 is adjacent to, for example, the memory region MR and the lead regions HR1 and HR2 in the Y direction.

A region of the CMOS chip CC is divided into, for example, a sense amplifier region SR, a peripheral circuit region PERI, transfer regions XR1 and XR2, and a pad region PR2. The sense amplifier module 14 is provided in the sense amplifier region SR. For example, the sequencer 13 is provided in the peripheral circuit region PERI. In the transfer regions XR1 and XR2, for example, a part (e.g., the block decoder BD) of circuits corresponding to the row decoder module 16 is provided. The sense amplifier region SR and the peripheral circuit region PERI are adjacent to each other in the Y direction. For example, a set of the sense amplifier region SR and the peripheral circuit region PERI is disposed below the memory region MR in the memory chip MC (i.e., overlapping when viewed in the Z direction), and is interposed between the transfer regions XR1 and XR2 in the X direction. The transfer regions XR1 and XR2 are disposed below and overlap with the lead regions HR1 and HR2 in the memory chip MC, respectively, when viewed in the Z direction. For example, the input/output circuit of the semiconductor memory device 1 is provided in the pad region PR2. The pad region PR2 is disposed below and overlaps with the pad region PR1 in the memory chip MC when viewed in the Z direction. In the other words, the sense amplifier region SR and the peripheral circuit region PERI are disposed at the other side in the Z direction with respect to the memory region MR, the transfer regions XR1 and XR2 are disposed at the other side in the Z direction with respect to the lead regions HR1 and HR2 in the memory chip MC, and the pad region PR2 (input/output circuit of the semiconductor memory device 1) is disposed at the other side in the Z direction with respect to the pad region PR1.

The memory chip MC has a plurality of bonding pads BP at the lower portion of each of the memory region MR, the lead regions HR1 and HR2, and the pad region PR1. The CMOS chip CC has a plurality of bonding pads BP at the upper portion of each of the sense amplifier region SR, the peripheral circuit region PERI, the transfer regions XR1 and XR2, and the pad region PR2.

The bonding pads BP in the memory region MR are electrically connected to bit lines BL, and overlap with the bonding pads BP in the sense amplifier region SR when viewed in the Z direction. The bonding pads BP in the lead region HR1 are electrically connected to word lines WL, and overlap with the bonding pads BP in the transfer region XR1 when viewed in the Z direction. The bonding pads BP in the lead region HR2 are electrically connected to the word lines WL, and overlap with the bonding pads BP in the transfer region XR2 when viewed in the Z direction. The bonding pads BP in the pad region PR1 overlap with the bonding pads BP in the pad region PR2 when viewed in the Z direction. In each region, the bonding pads BP on the memory chip MC and on the CMOS chip CC that face each other are bonded and electrically connected.

In addition, the overall structure of the semiconductor memory device 1 according to the first embodiment is not limited to the above-described structure as long as, for example, at least one lead region HR adjacent to the memory region MR is provided. The semiconductor memory device 1 may have a plurality of sets of the memory regions MR and the lead regions HR. In this case, a set of the sense amplifier region SR, the transfer region XR, and the peripheral circuit region PERI is appropriately provided corresponding to the arrangement of the memory region MR and the lead region HR.

(Structure in Memory Chip MC of Semiconductor Memory Device 1)

Figure 7:
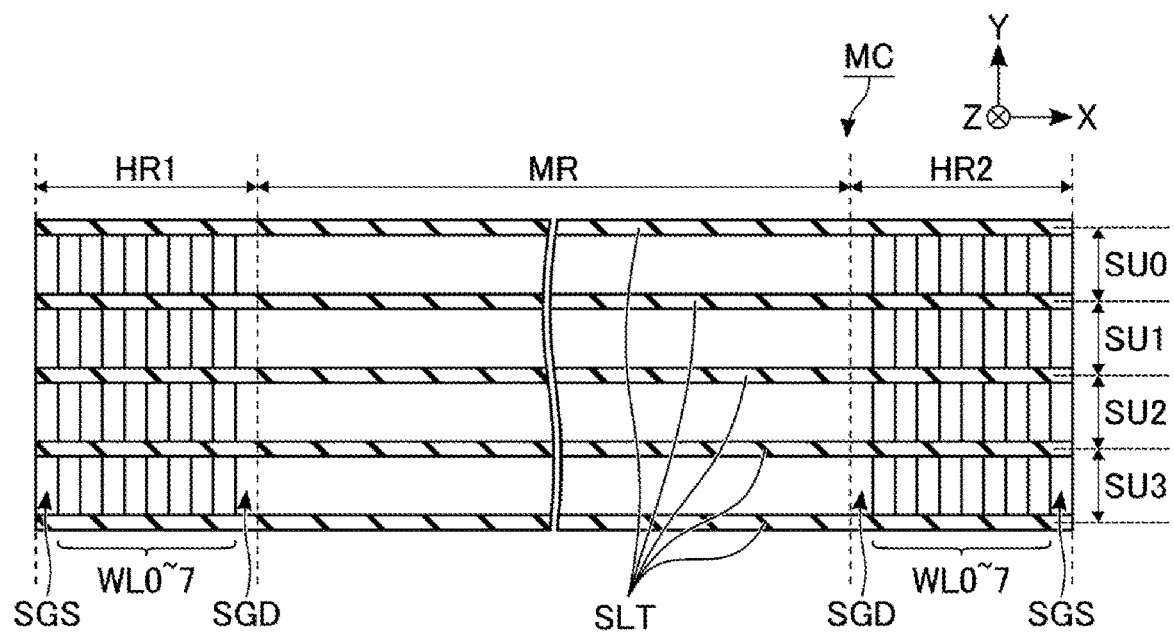
FIG. 7 is a plan view illustrating an example of a planar layout of a memory chip in the semiconductor memory device according to the first embodiment.

FIG. 7 is an example of a planar layout in the memory chip MC of the semiconductor memory device 1 according to the first embodiment, and illustrates an area corresponding to one block BLK (i.e., the string units SU0 to SU3) in the memory region MR and the lead regions HR1 and HR2. As illustrated in FIG. 7, the memory chip MC includes a plurality of slits SLT.

Each of the plurality of slits SLT is provided extending along the X direction, and crosses the memory region MR and the lead regions HR1 and HR2 in the X direction. The plurality of slits SLT is arranged in the Y direction. The slit SLT has a structure in which an insulating member is embedded, and divides conductor layers which are provided in the same wiring layer and are adjacent to each other through the corresponding slit SLT. Specifically, the slit SLT divides a plurality of wiring layers corresponding to the word lines WL0 to WL7, and the select gate lines SGD and SGS, respectively.

In each of the lead regions HR1 and HR2, for example, wiring layers extending from the memory region MR are provided in a stepwise form. Then, in a step portion of each of the lead regions HR1 and HR2, a plurality of contacts is provided to electrically connect the word lines WL0 to WL7 and the select gate lines SGS and SGD connected to the NAND strings NS, to the row decoder module 16.

In the above-described planar layout of the memory cell array 10 in the embodiment, each area separated by the slits SLT corresponds to one string unit SU. That is, in this example, the string units SU0 to SU3 each extending in the X direction are arranged in the Y direction. Then, in the memory region MR and the lead regions HR1 and HR2, for example, the layout illustrated in FIG. 7 is repeated in the Y direction.

In the example illustrated in FIG. 7, string units SU corresponding to the same block BLK are completely separated by the slits SLT. In this case, each of the word line WL and the select gate line SGS, which is divided by the slits SLT in the same block BLK and is provided in the same wiring layer, is electrically connected via different wiring layers.

The string units SU corresponding to the same block BLK may not be necessarily completely separated by the slits SLT as long as, for example, the memory region MR and the select gate line SGD are divided by the slits SLT provided inside the same block BLK. In this case, the word line WL provided in the same wiring layer in the same block BLK is continuously provided in the lead regions HR1 and HR2, and is electrically connected.

Figure 8:
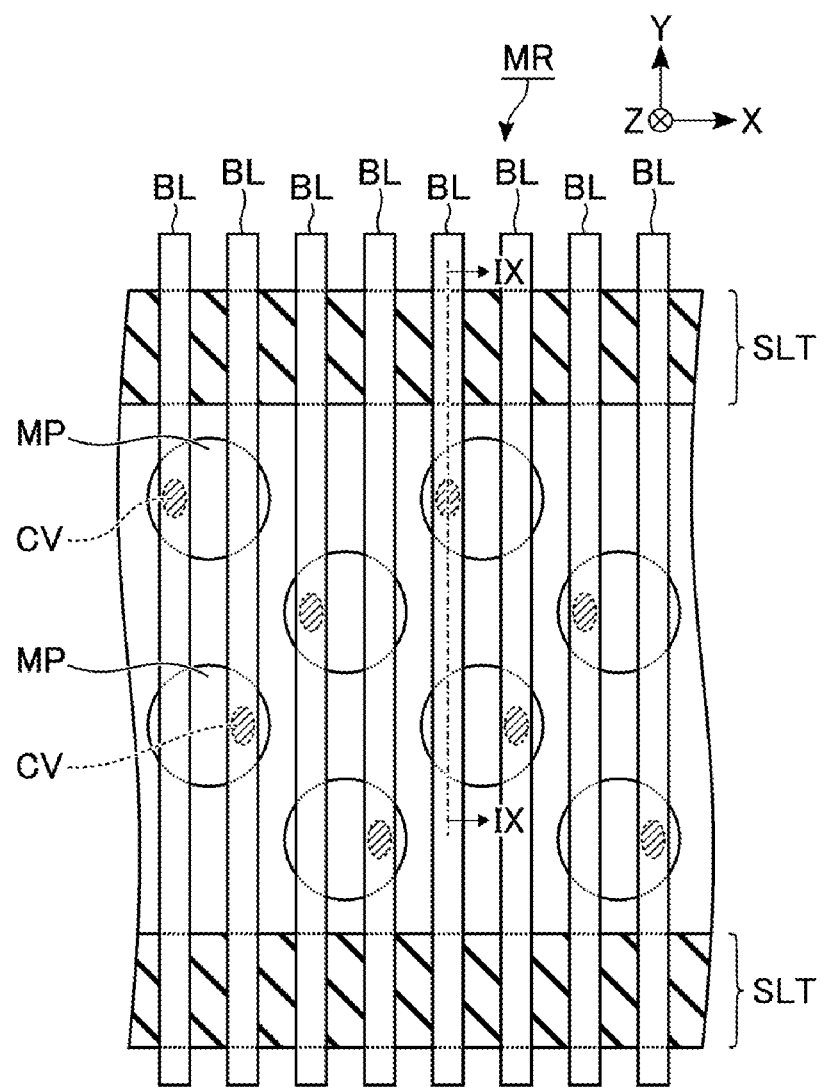
FIG. 8 is a plan view illustrating an example of a planar layout in a memory region of the semiconductor memory device according to the first embodiment.

FIG. 8 illustrates an example of a planar layout in the memory region MR of the semiconductor memory device 1 according to the first embodiment. As illustrated in FIG. 8, in the memory region MR, the semiconductor memory device further includes a plurality of memory pillars MP, a plurality of contacts CV, and a plurality of bit lines BL.

Each memory pillar MP functions as, for example, one NAND string NS. The plurality of memory pillars MP is arranged in, for example, four rows of staggered patterns in an area between two adjacent slits SLT. The present disclosure is not limited thereto, and the number and arrangement of the memory pillars MP between the two adjacent slits SLT may be appropriately changed. A set of the memory pillars MP disposed between the adjacent slits SLT corresponds to, for example, one string unit SU.

The plurality of bit lines BL is arranged in the X direction, in which each of the bit lines BL extends in the Y direction. Each bit line BL overlaps with at least one memory pillar MP in each string unit SU when viewed in the Z direction. In this example, two bit lines BL overlap with each memory pillar MP when viewed in the Z direction. The contact CV is provided between one bit line BL among the plurality of bit lines BL, which overlaps with the memory pillar MP when viewed in the Z direction, and the corresponding memory pillar MP. Each memory pillar MP is electrically connected to the corresponding bit line BL via the contact CV.

Figure 9:
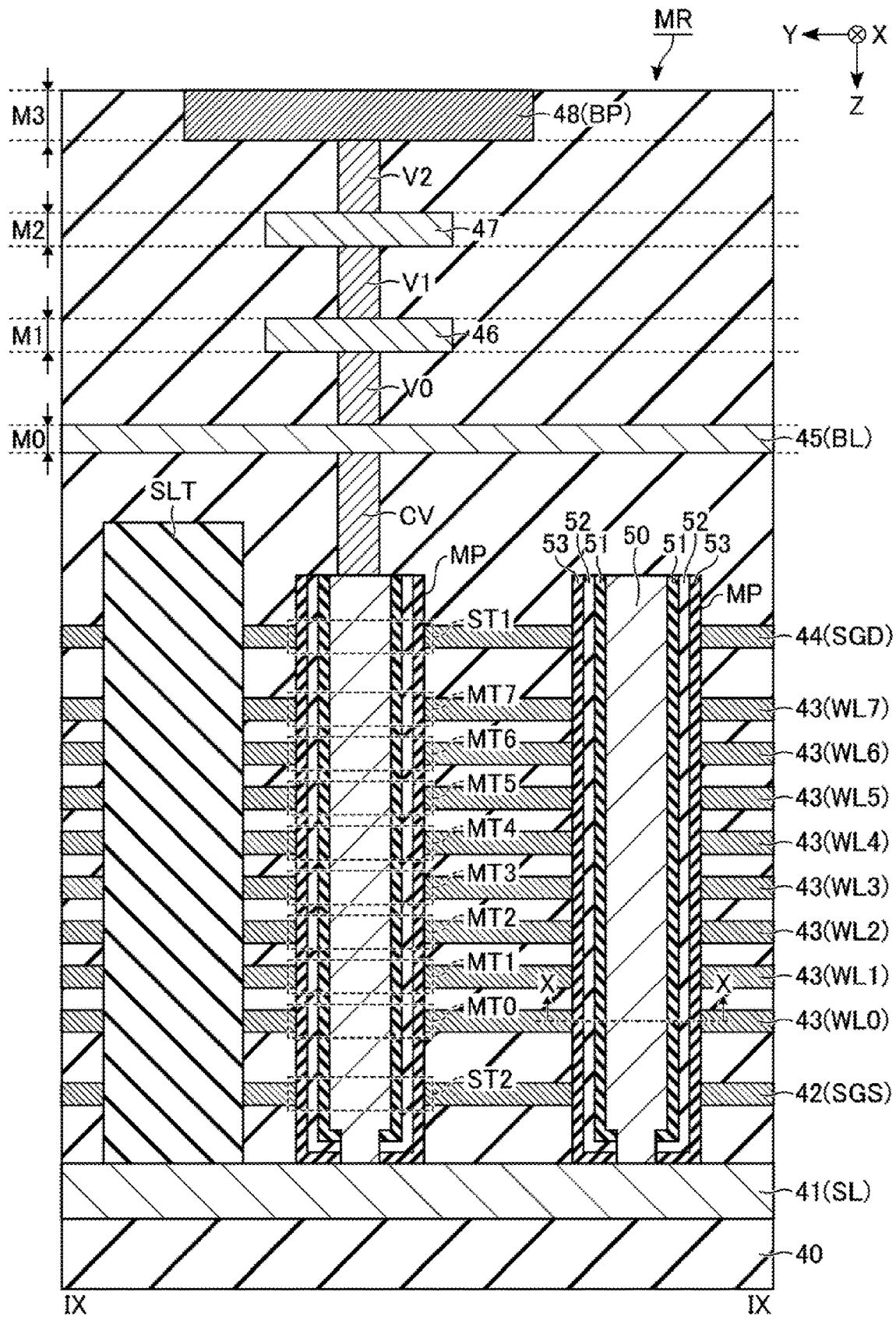
FIG. 9 is a cross-sectional view taken along the IX-IX line of FIG. 8, which illustrates an example of a cross-sectional structure in the memory region of the semiconductor memory device according to the first embodiment.

FIG. 9 is a cross-sectional view taken along the IX-IX line of FIG. 8, and illustrates an example of a cross-sectional structure in the memory region MR of the semiconductor memory device 1 according to the first embodiment. The semiconductor memory device 1 illustrated in FIG. 9 is upside down in the illustration, and so, the bonding pad BP is located at the top side in FIG. 9 and all directional references to elements in FIG. 9 (e.g., upper, lower, top, bottom, etc.) will be made relative to the illustration in FIG. 9. As illustrated in FIG. 9, in the memory region MR, the semiconductor memory device 1 further includes, for example, an insulator layer 40, conductor layers 41 to 48, and contacts V0 to V2.

The insulator layer 40 is an insulator layer provided in the bottom layer as illustrated. Alternatively, the insulator layer 40 may be provided as a semiconductor layer which contains, for example, silicon (Si). Above the insulator layer 40 (i.e., at the other side in the Z direction with respect to the insulator layer 40), the conductor layer 41 is provided. The conductor layer 41 is formed in, for example, a plate shape spreading along the XY plane, and is used as the source line SL. The conductor layer 41 may contain, for example, silicon (Si). That is, the conductor layer may be formed from, for example, poly-silicon.

Above the conductor layer 41, the conductor layer 42 is provided via an insulator layer. The conductor layer 42 is formed in, for example, a plate shape spreading along the XY plane, and is used as the select gate line SGS. The conductor layer 42 contains, for example, tungsten (W).

Above the conductor layer 42, the conductor layer 43 and an insulator layer are alternately stacked. The conductor layer 43 is formed in, for example, a plate shape spreading along the XY plane. The plurality of stacked conductor layers 43 is used as the word lines WL0 to WL7, respectively, in order from the insulator layer 40 side. The conductor layer 43 contains, for example, tungsten (W).

Above the top conductor layer 43, the conductor layer 44 is provided via an insulator layer. The conductor layer 44 is formed in, for example, a plate shape spreading along the XY plane, and is used as the select gate line SGD. The conductor layer 44 contains, for example, tungsten (W).

Above the conductor layer 44, the conductor layer 45 is provided via an insulator layer. The conductor layer 45 is formed in, for example, a line shape extending in the Y direction, and is used as the bit line BL. That is, the plurality of conductor layers 45 is arranged along the X direction. The conductor layer 45 contains, for example, copper (Cu). Hereinafter, a wiring layer in which the conductor layer 45 (in particular, the bit line BL) is provided is called a wiring layer M0.

Above the conductor layer 45, the conductor layer 46 is provided via an insulator layer. The conductor layer 46 is used as a wiring that relays, for example, connection between the bonding pad BP and the bit line BL. The conductor layer 46 and the conductor layer 45 are connected by the contact V0. The conductor layer 46 contains, for example, copper (Cu). Hereinafter, a wiring layer in which the conductor layer 46 is provided is called a wiring layer M1.

Above the conductor layer 46, the conductor layer 47 is provided via an insulator layer. The conductor layer 47 is used as a wiring that relays, for example, connection between the bonding pad BP and the bit line BL. The conductor layer 47 and the conductor layer 46 are connected by the contact V1. The conductor layer 47 contains, for example, copper (Cu). Hereinafter, a wiring layer in which the conductor layer 47 is provided is called a wiring layer M2.

Above the conductor layer 47, the conductor layer 48 is provided via an insulator layer. The conductor layer 48 is used as the bonding pad BP, and is disposed at the uppermost portion of the memory region MR as illustrated (but lowermost when the memory chip MC is bonded to the CMOS chip CC). For example, the conductor layer 48 (in particular, the bonding pad BP) and the conductor layer 47 are connected by the contact V2. The conductor layer 48 contains, for example, copper (Cu). Hereinafter, a wiring layer in which the conductor layer 48 is provided is called a wiring layer M3.

The slit SLT is formed in, for example, a plate shape spreading along the XZ plane, and divides the conductor layers 42 to 44. The lower end of the slit SLT (as illustrated) is in contact with, for example, the conductor layer 41. The upper end of the slit SLT (as illustrated) is provided in, for example, a layer between the conductor layers 44 and 45.

Each memory pillar MP is provided extending along the Z direction, and passes through the conductor layers 42 to 44. The bottom portion of the memory pillar MP is in contact with the conductor layer 41. Each memory pillar MP includes, for example, a semiconductor layer 50, a tunnel insulating film 51, an insulating film 52, and a block insulating film 53.

The semiconductor layer 50 is provided extending along the Z direction. For example, the lower end of the semiconductor layer 50 is in contact with the conductor layer 41, and the upper end of the semiconductor layer 50 is provided in a layer between the conductor layers 44 and 45. The tunnel insulating film 51 covers the side surface of the semiconductor layer 50. The insulating film 52 covers the side surface of the tunnel insulating film 51. The block insulating film 53 covers the side surface of the insulating film 52. Each of the tunnel insulating film 51 and the block insulating film 53 contains, for example, silicon oxide (SiO2). The insulating film 52 contains, for example, silicon nitride (SiN). If the insulator layer 40 is provided as the semiconductor layer containing silicon (Si), the conductor layer 41 may be omitted, and the bottom portion of the memory pillar MP may be in contact with the semiconductor layer.

A columnar contact CV is provided above the semiconductor layer 50 in the memory pillar MP. In the illustrated area, a contact CV corresponding to one memory pillar MP is illustrated. Another contact, which is not illustrated, is connected to a memory pillar MP not connected to the contact CV.

One conductor layer 45, that is, one bit line BL is in contact with the upper surface of the contact CV. In each space separated by the slits SLT, one contact CV is connected to one conductor layer 45. That is, to each conductor layer 45, one memory pillar MP between two adjacent slits SLT is electrically connected.

Figure 10:
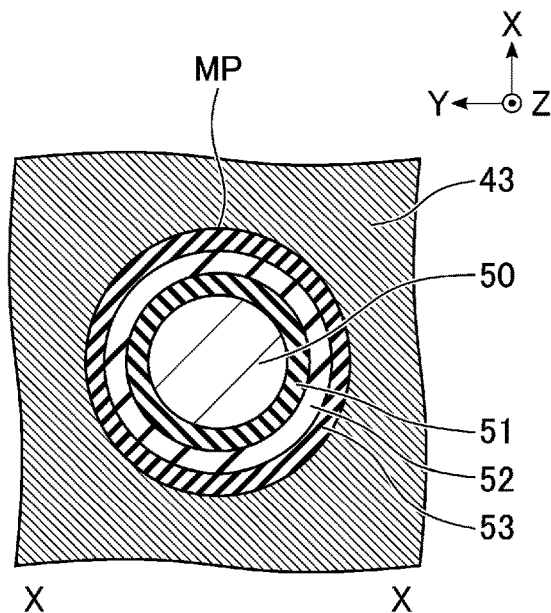
FIG. 10 is a cross-sectional view taken along the X-X line of FIG. 9, which illustrates an example of a cross-sectional structure of a memory pillar in the semiconductor memory device according to the first embodiment.

FIG. 10 is a cross-sectional view taken along the X-X line of FIG. 9, and illustrates an example of a cross-sectional structure of the memory pillar MP in the semiconductor memory device 1 according to the first embodiment. As illustrated in FIG. 10, in the layer including the conductor layer 43, the semiconductor layer 50 is provided in, for example, the central portion of the memory pillar MP. The tunnel insulating film 51 surrounds the side surface of the semiconductor layer 50. The insulating film 52 surrounds the side surface of the tunnel insulating film 51. The block insulating film 53 surrounds the side surface of the insulating film 52. The conductor layer 43 surrounds the side surface of the block insulating film 53. Each memory pillar MP may further include an insulator layer inside the semiconductor layer 50, and the corresponding insulator layer may be located in the central portion of the memory pillar MP.

In the above-described structure of the memory pillar MP, a portion where the memory pillar MP and the conductor layer 42 intersect functions as the select transistor ST2. A portion where the memory pillar MP and the conductor layer 43 intersect functions as the memory cell transistor MT. A portion where the memory pillar MP and the conductor layer 44 intersect functions as the select transistor ST1. That is, the semiconductor layer 50 functions as a channel for each of the memory cell transistors MT0 to MT7 and the select transistors ST1 and ST2. The insulating film 52 functions as a charge storage layer of the memory cell transistor MT.

Figure 11A:
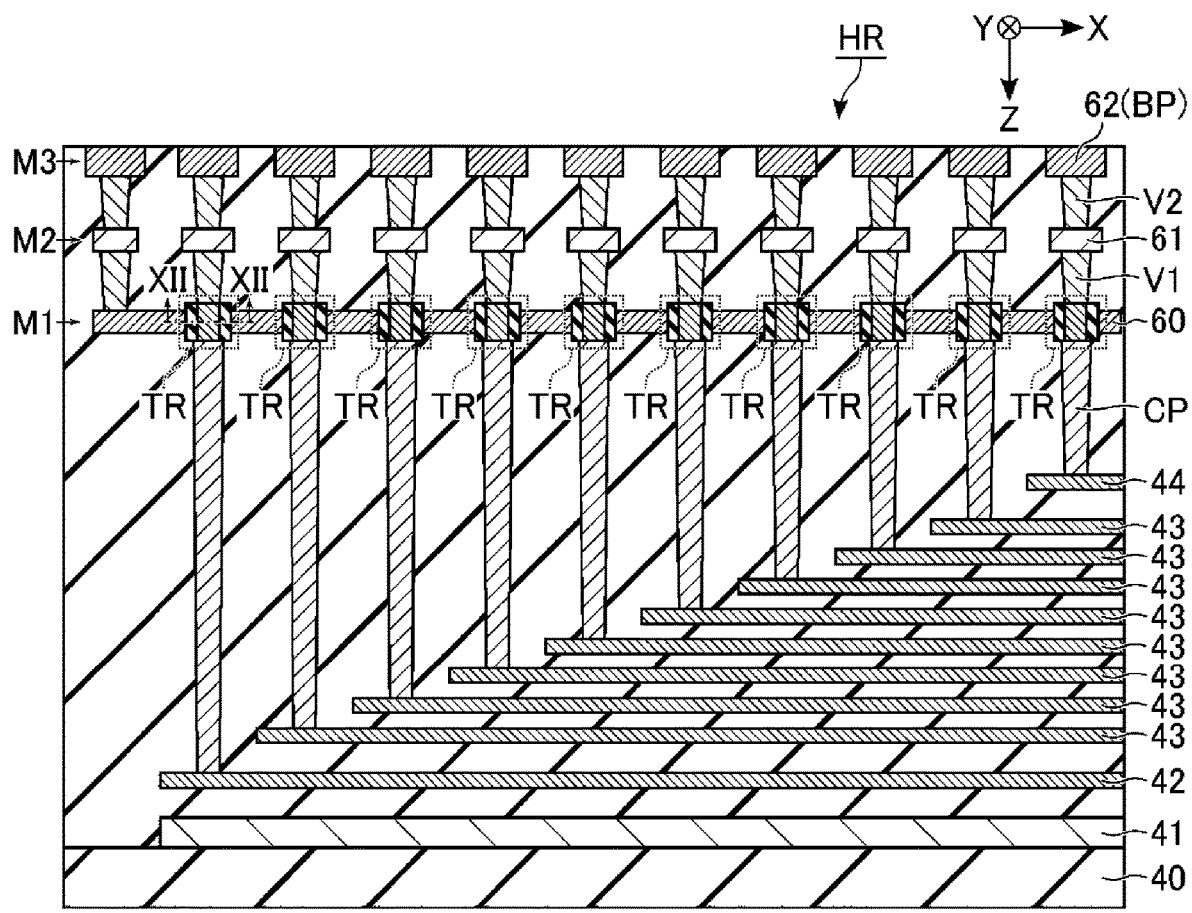
FIG. 11A is a cross-sectional view illustrating an example of a cross-sectional structure in a lead region of one block of the semiconductor memory device according to the first embodiment.
Figure 11B:
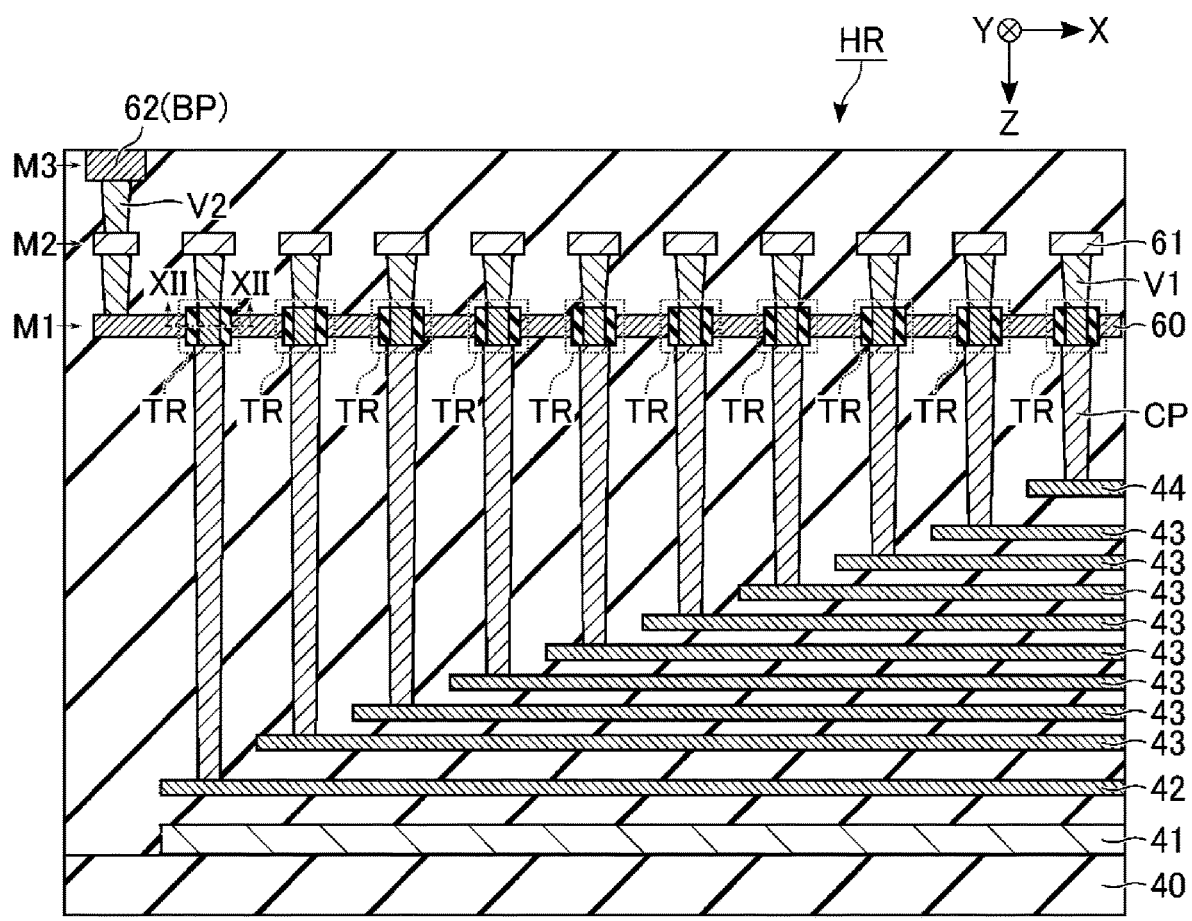
FIG. 11B is a cross-sectional view illustrating another example of a cross-sectional structure in a lead region of another block of the semiconductor memory device according to the first embodiment.

Each of FIG. 11A and FIG. 11B illustrates an example of a cross-sectional structure in the lead region HR of the semiconductor memory device 1 according to the first embodiment. FIG. 11A corresponds to the lead region HR of one block BLK in the semiconductor memory device 1, and FIG. 11B corresponds to the lead region HR of another block BLK in the semiconductor memory device 1.

As illustrated in FIG. 11A, in the lead region HR of one block BLK, the end portions of the select gate line SGS, the word lines WL0 to WL7, and the select gate line SGD, respectively, are provided in a stepwise form in which steps are formed in this order in the X direction. That is, in the lead region HR, each of the select gate line SGS, the word lines WL0 to WL7, and the select gate line SGD has a terrace portion at the end portion thereof, which is not overlapped with the wiring layer that is above.

In the above-described lead region HR of one block BLK, the semiconductor memory device 1 further includes a plurality of contacts CP, V1 and V2, a plurality of transistors TR, a conductor layer 60, a plurality of conductor layers 61, and a plurality of conductor layers 62.

Each of the plurality of contacts CP is provided at the terrace portion of each of the conductor layer 42 corresponding to the select gate line SGS, the plurality of conductor layers 43 corresponding to the word lines WL0 to WL7, respectively, and the conductor layer 44 corresponding to the select gate line SGD.

One transistor TR is provided above each contact CP. In the other words, each of the transistors TR is provided at the other side in the Z direction with respect to the corresponding one of the contacts CP. In this example, the transistor TR is a vertical transistor, and is capable of controlling current flowing between two contacts that are in contact with the upper surface and the lower surface of the transistor TR, respectively. In this specification, the "vertical transistor" indicates a transistor whose channel direction is perpendicular to the surface of the semiconductor substrate.

Each of the plurality of transistors TR passes through the conductor layer 60. The conductor layer 60 is provided in, for example, a plate shape extending in the X direction. The conductor layer 60 is provided in, for example, the wiring layer M1, and functions as the transfer gate line TG shared by the plurality of transistors TR.

Each of the plurality of contacts V1 is provided, for example, above each of the plurality of transistors TR and above the conductor layer 60. Above each contact V1, one conductor layer 61 is provided. The conductor layer 61 is provided in, for example, the wiring layer M2, and functions as a signal line connected to the row decoder module 16. The contact V1 connects the corresponding conductor layer 61 to the transistor TR, and the conductor layer 60 to the conductor layer 61.

Each of the plurality of contacts V2 is provided above, for example, each of the plurality of conductor layers 61. For example, one conductor layer 62 is provided above each contact V2. The conductor layer 62 is provided in, for example, the wiring layer M3, and is used as the bonding pad BP. The corresponding conductor layer 61 and the conductor layer 62 are connected by the contact V2. The conductor layer 62 contains, for example, copper (Cu).

As illustrated in FIG. 11B, the lead region HR of another block BLK also has the same configuration as the above-described lead region HR of one block BLK, except that only one contact V2 and only one conductor layer 62 are provided.

Figure 12:
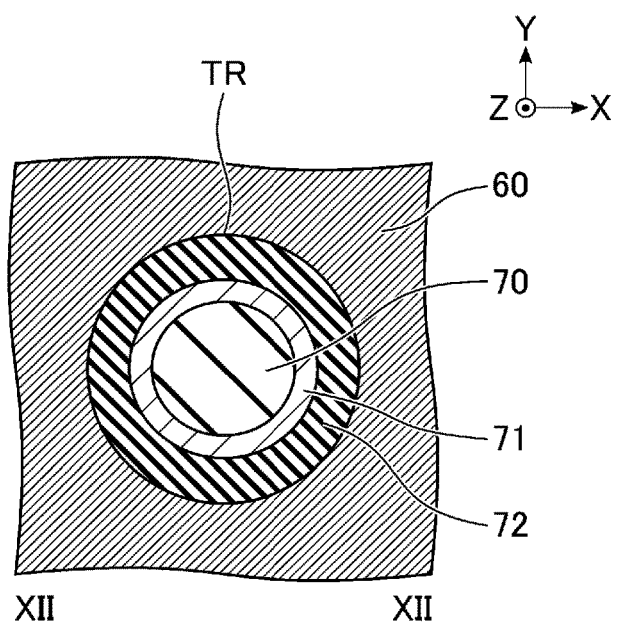
FIG. 12 is a cross-sectional view taken along the XII-XII line of FIG. 11A, which illustrates an example of a cross-sectional structure of a vertical transistor in the semiconductor memory device according to the first embodiment.

FIG. 12 is a cross-sectional view taken along the XII-XII line of FIG. 11A, and illustrates an example of a cross-sectional structure of the transistor TR in the semiconductor memory device 1 according to the first embodiment. As illustrated in FIG. 12, the transistor TR includes an insulator layer 70, a semiconductor layer 71, and a gate insulating film 72.

In the wiring layer of the conductor layer 60, the insulator layer 70 is provided in, for example, the central portion of the transistor TR. The semiconductor layer 71 surrounds the side surface of the insulator layer 70. The gate insulating film 72 surrounds the side surface of the semiconductor layer 71. The conductor layer 60 surrounds the side surface of the gate insulating film 72. That is, the semiconductor layer 71 and the conductor layer 60 are insulated from each other by the gate insulating film 72. Accordingly, the semiconductor layer 71 functions as a channel of the transistor TR. For example, each of the insulator layer 70 and the gate insulating film 72 contains silicon oxide ($SiO_2$). In alternative embodiments, in each transistor TR, the insulator layer 70 may be omitted.

Figure 13:
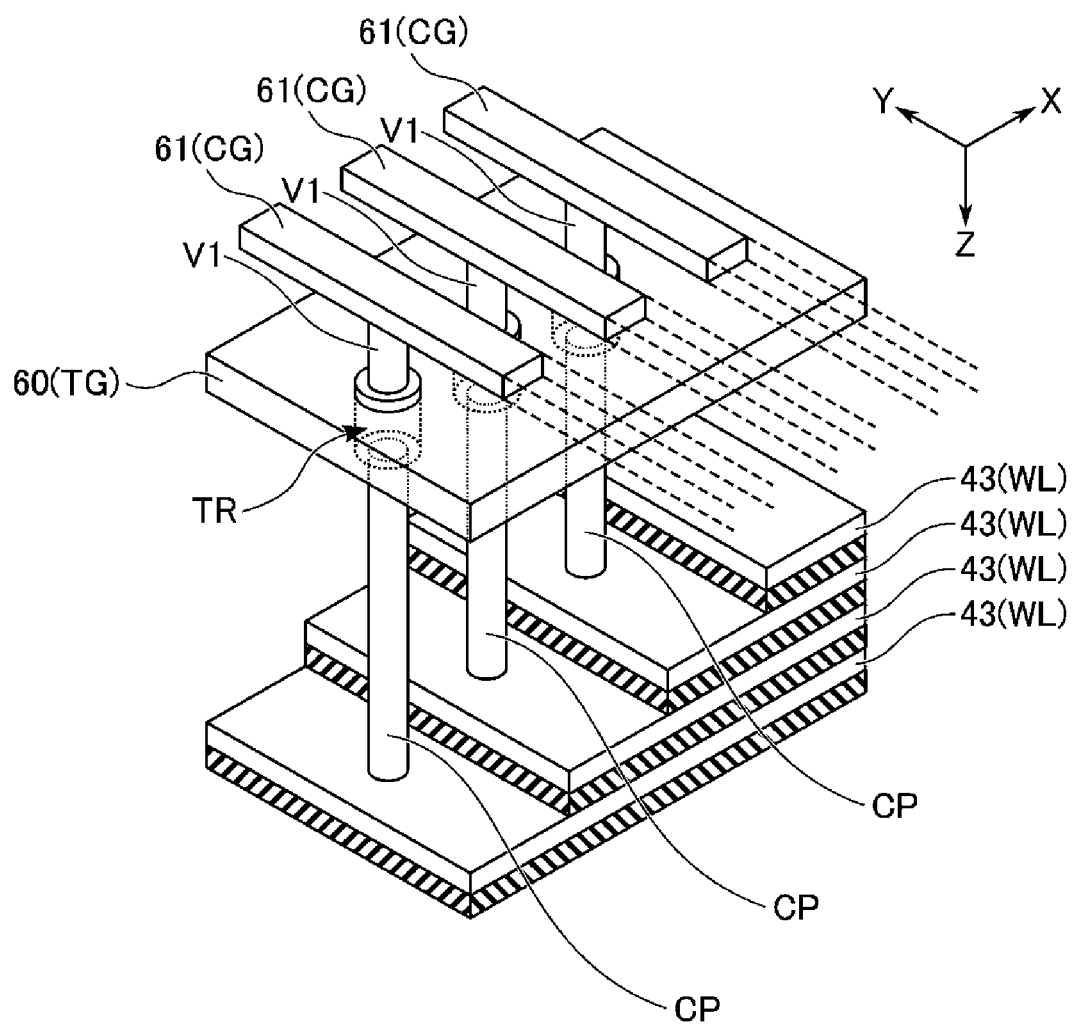
FIG. 13 is a perspective view illustrating an example of the structure in the lead region of the semiconductor memory device according to the first embodiment.

FIG. 13 is a perspective view illustrating an example of the structure in the lead region HR of the semiconductor memory device 1 according to the first embodiment, in which a part of a step structure of stacked wirings in the lead region HR is extracted. As illustrated in FIG. 13, the contact CP is connected to the terrace portion of the conductor layer 43 (for the word line WL). Then, the transistor TR passing through the plate-shaped conductor layer 60 (which is the transfer gate line TG) is connected to the corresponding contact CP. The conductor layer 61 (for the signal line CG) is connected to the transistor TR via the contact V1. The conductor layer 61 (for the signal line CG) is provided over the lead region HR of the plurality of blocks BLK.

Likewise, the conductor layer 61 (for the signal line SGSD or SGDD in an area not illustrated) is connected to the select gate line SGS or the select gate line SGD via the contact CP, the transistor TR, and the contact V1.

In the above-described structure in the lead region HR of the semiconductor memory device 1 according to the first embodiment, each of the word lines WL0 to WL7 and the select gate lines SGD and SGS is electrically connected to the row decoder module 16 via a set of the corresponding contact CP and the vertical transistor TR.

(Structure in CMOS Chip CC of Semiconductor Memory Device 1)

Figure 14:
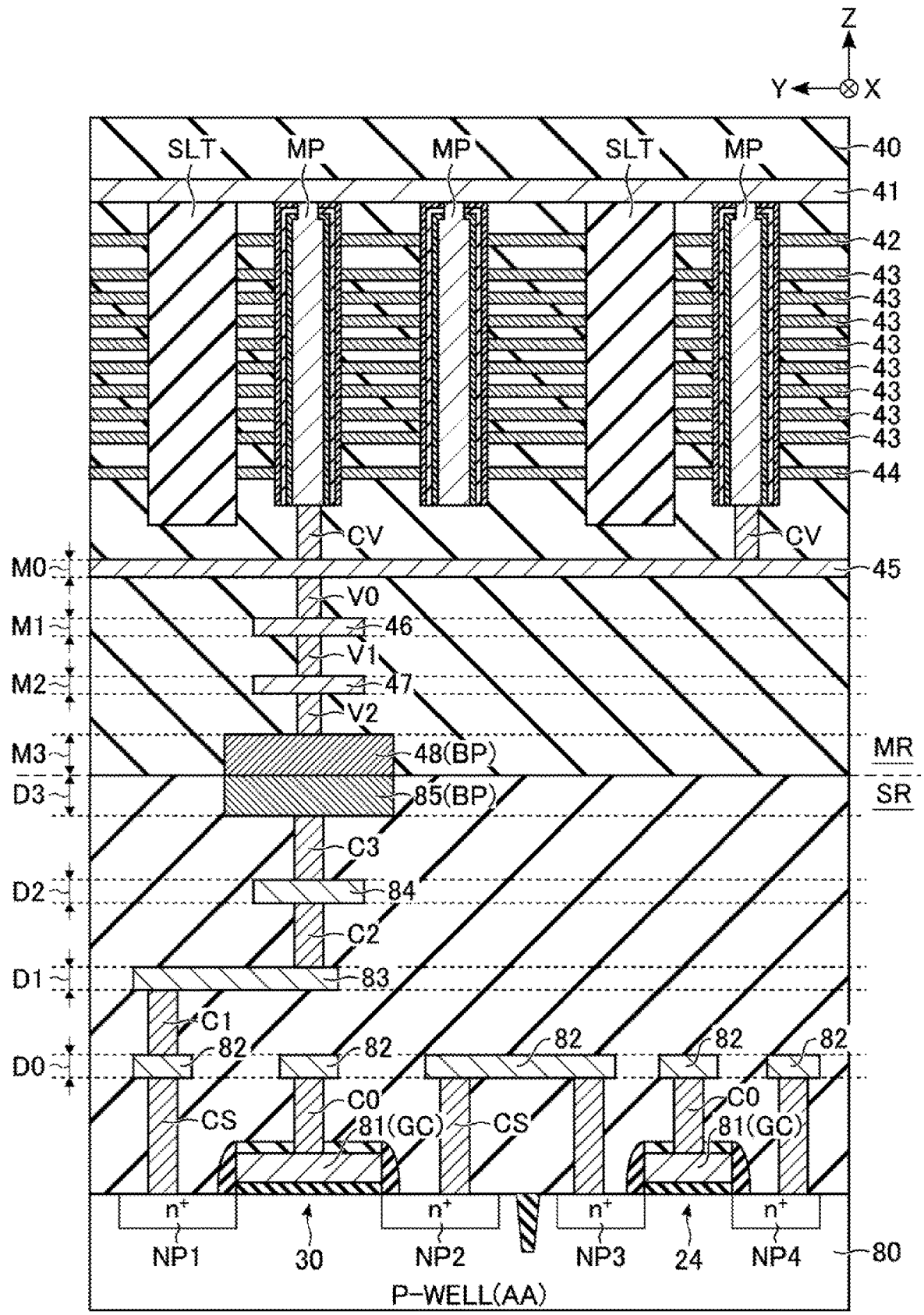
FIG. 14 is a cross-sectional view illustrating an example of a cross-sectional structure in the memory region and a sense amplifier region of the semiconductor memory device according to the first embodiment.

FIG. 14 illustrates an example of a cross-sectional structure in the sense amplifier region SR of the semiconductor memory device 1 according to the first embodiment. FIG. 14 illustrates an area including the transistor 30 and the bonding pad BP, and also illustrates the memory region MR disposed on the sense amplifier region SR. As illustrated in FIG. 14, in the sense amplifier region SR, the semiconductor memory device 1 includes, for example, a P-type well region 80, conductor layers 81 to 85, and columnar contacts CS and C0 to C3.

The P-type well region 80 includes a P-type impurity, and corresponds to an active area AA in which a high breakdown voltage transistor is provided. The P-type well region 80 includes, for example, N-type regions NP1 to NP4 arranged in the Y direction. Each of the N-type regions NP1 to NP4 is a region where an N-type impurity is diffused, and is provided near the surface of the P-type well region 80.

The conductor layer 81 is provided above (at the one side in the Z direction with respect to) the P-type well region 80 between the N-type regions NP1 and NP2 via a gate insulating film. The conductor layer 81 is used as a gate line GC. The conductor layer 81 between the N-type regions NP1 and NP2 corresponds to the transistor 30 in the bit line connector BLHU. Likewise, the conductor layer 81 is provided above (at the one side in the Z direction with respect to the P-type well region 80 between the N-type regions NP3 and NP4 via a gate insulating film. The conductor layer 81 between the N-type regions NP3 and NP4 corresponds to the transistor 24 in the sense amplifier SA. Each contact CS is provided on each of the N-type regions NP1 to NP4. The contact C0 is provided on the conductor layer 81. For example, the upper surface of the contact CS is flush with the upper surface of the contact C0.

One conductor layer 82 is provided on each of the contacts CS and C0. The contact C1 is provided on the conductor layer 82. The conductor layer 83 is provided on the contact C1. The contact C2 is provided on the conductor layer 83. The conductor layer 84 is provided on the contact C2. The contact C3 is provided on the conductor layer 84. The conductor layer 85 is provided on the contact C3. The conductor layer 85 contains, for example, copper (Cu). Hereinafter, wiring layers in which the conductor layers 82, 83, 84 and 85 are provided, respectively, are called wiring layers D0, D1, D2 and D3, respectively.

The conductor layer 85 is used as the bonding pad BP, and is disposed at the uppermost portion of the sense amplifier region SR. Then, the conductor layer 85 is electrically connected to the opposing conductor layer 48. That is, the conductor layer 85 (the bonding pad BP) in the sense amplifier region SR is bonded to the conductor layer (the bonding pad BP) in the opposing memory region MR.

The above-described structure in the sense amplifier region SR of the semiconductor memory device 1 may be similarly provided in other regions in the CMOS chip CC. For example, a circuit (e.g., the block decoder BD) corresponding to the row decoder module 16 or a circuit corresponding to the driver module 15, which is provided in the transfer region XR, is formed with a structure similar to that of the transistor 30 in FIG. 14. Then, the block decoder BD or the circuit corresponding to the driver module is electrically connected to the bonding pad BP (the conductor layer 62) in the memory chip MC via the bonding pad BP electrically connected to the corresponding circuit in the CMOS chip CC.

[1-2] Effects of First Embodiment

According to the above-described semiconductor memory device 1 according to the first embodiment, a chip area may be reduced, and also the manufacturing cost of the semiconductor memory device 1 can be reduced. Hereinafter, details of the effects in the semiconductor memory device 1 according to the first embodiment will be described.

A circuit configuration in a semiconductor memory device such as a NAND-type flash memory is roughly divided into a memory cell array and other peripheral circuits. In order to reduce a unit cost of the semiconductor memory device, it is desirable to increase the percentage (cell occupancy) of an area corresponding to the memory cell array in the chip area of the semiconductor memory device.

Meanwhile, the semiconductor memory device 1 according to the first embodiment includes the memory chip MC including the memory cell array 10, and the CMOS chip CC including other peripheral circuits. The memory chip MC and the CMOS chip CC are formed on different wafers, respectively. Then, the memory chip MC and the CMOS chip CC are bonded to each other so as to form one semiconductor chip corresponding to the semiconductor memory device 1. In such a semiconductor memory device 1, the bonding pads BP facing each other between the memory chip MC and the CMOS chip CC are bonded to each other so that the upper and lower chips are electrically connected.

Accordingly, the semiconductor memory device 1 according to the first embodiment may have a structure in which the memory cell array 10 is above (at the one side in the Z direction with respect to) the peripheral circuits, and thus the cell occupancy may be increased. In the semiconductor memory device 1 according to the first embodiment, since heat during formation of the memory cell array 10 has no influence transistors in the CMOS chip CC (because the two chips are manufactured separately), it is possible to lower the design difficulty of the transistors in the CMOS chip CC.

In a conventional semiconductor memory device having the above-described bonding structure, for example, the stacked wirings such as the word lines WL provided in the memory chip MC are connected to the row decoder module 16 in the CMOS chip CC via the bonding pads BP in the lead region HR. For example, when all circuits corresponding to the row decoder module 16 are provided in the CMOS chip CC, the number of bonding pads BP provided in the lead region HR is the same as the number of stacked wirings connected to the transistors TR. That is, the number of bonding pads BP in the lead region HR is equal to a number obtained by multiplying the number of blocks BLK by the number of layers of the stacked wirings.

In contrast, the semiconductor memory device 1 according to the first embodiment has a structure in which the transistors TR in the row decoder module 16 are provided on the memory chip MC side. As such, when at least one bonding pad BP is provided for various signal lines shared among blocks BLK, electrical connection with the driver module 15 in the CMOS chip CC may be made.

Thus, the number of bonding pads BP provided in the lead region HR becomes the same as, for example, the sum of the number of signal lines CG0 to CG7, SGDD0 to SGDD3, SGSD, and USGS, and the number of wirings corresponding to the transfer gate lines TG and TGb, respectively. That is, in the first embodiment, the number of bonding pads BP corresponding to the stacked wirings is determined without depending on the number of blocks BLK.

That is, as illustrated in FIG. 11A, in the lead region HR of one block BLK, bonding pads BP corresponding to the signal lines CG0 to CG7, SGDD0 to SGDD3, SGSD, and USGS are required. Meanwhile, as illustrated in FIG. 11B, in the lead region HR of another block BLK, only the bonding pad BP corresponding to the transfer gate lines TG and TGb is required. Therefore, in the semiconductor memory device 1 according to the first embodiment, it is possible to reduce the total number of bonding pads BP corresponding to the signal lines CG0 to CG7, SGDD0 to SGDD3, SGSD, and USGS.

As a result, in the semiconductor memory device 1 according to the first embodiment, the number of bonding pads BP provided in the lead region HR may be small as compared to that in a case where all elements corresponding to the row decoder module 16 are provided in the CMOS chip CC. Further, in the semiconductor memory device 1 according to the first embodiment, since an area corresponding to the transistors TR may be omitted in the CMOS chip CC, an area of circuits corresponding to the row decoder module 16 may be reduced in the CMOS chip CC.

As described above, the semiconductor memory device 1 according to the first embodiment may increase the cell occupancy, and may reduce the chip area of the CMOS chip CC. Therefore, the semiconductor memory device 1 according to the first embodiment may reduce the chip area, thereby reducing the manufacturing cost of the semiconductor memory device 1.

In addition, the arrangement of bonding pads BP in the lead region HR is not limited to an example illustrated in FIG. 11A and FIG. 11B. For example, bonding pads BP corresponding to the signal lines CG0 to CG7, SGDD0 to SGDD3, SGSD, and USGS may not be locally provided in a lead region HR of one block BLK, and may be arranged in lead regions HR of a plurality of blocks BLK in a distributed manner.

[2] Second Embodiment

The semiconductor memory device 1 according to a second embodiment has a structure in which the transistor TR in the memory chip MC in the first embodiment includes a lateral transistor. Hereinafter, descriptions will be made on the semiconductor memory device 1 according to the second embodiment, focusing on differences from the first embodiment.

[2-1] Structure in Lead Region HR of Semiconductor Memory Device 1

Figure 15:
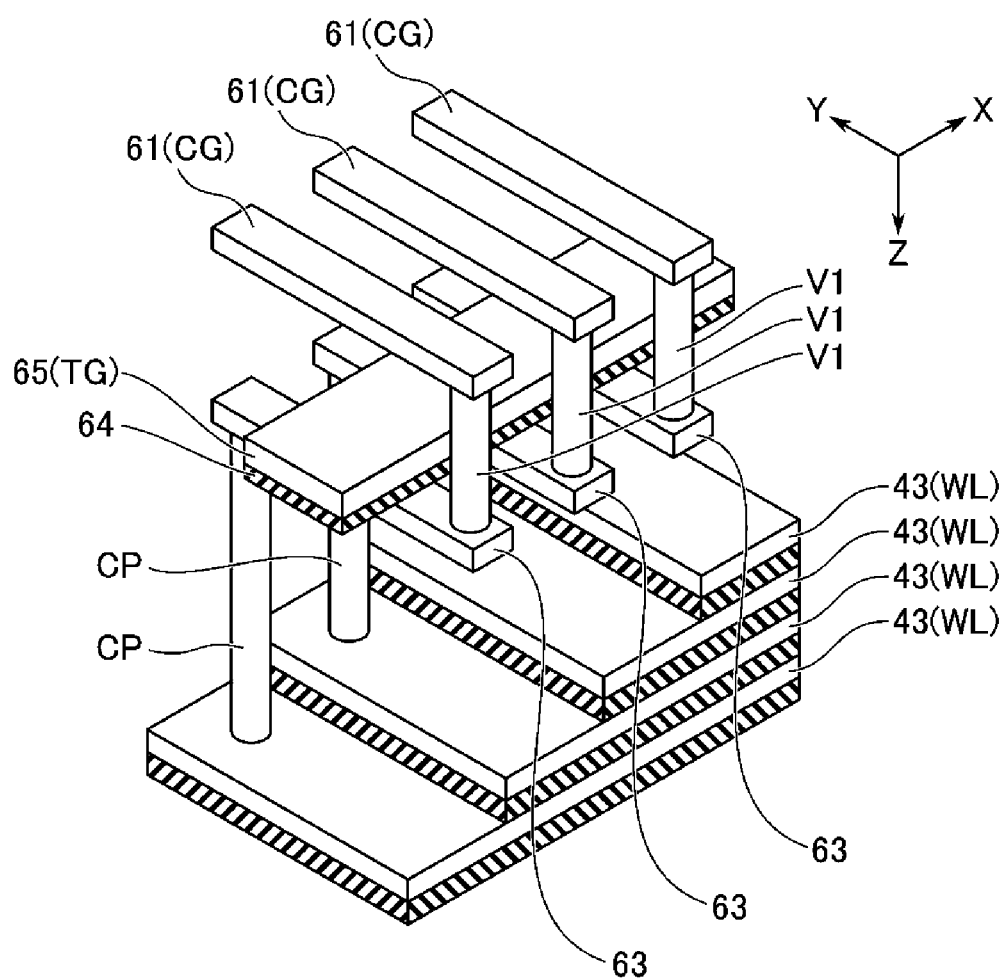
FIG. 15 is a perspective view illustrating an example of the structure in a lead region of a semiconductor memory device according to a second embodiment.

FIG. 15 is a perspective view illustrating an example of the structure in the lead region HR of the semiconductor memory device 1 according to the second embodiment, in which the same area as that in FIG. 13 is extracted. As illustrated in FIG. 15, the semiconductor memory device 1 according to the second embodiment has a structure in which, for example, a structure corresponding to the transistors TR is replaced with a plurality of conductor layers 63, an insulator layer 64, and a conductor layer 65.

The plurality of conductor layers 63 is arranged in the X direction, in which each of the conductor layers 63 extends in the Y direction. The contact CP is connected to one end portion of each conductor layer 63, and the contact V1 is connected to the other end portion. The insulator layer 64 is provided above (at the other side in the Z direction with respect to) the plurality of conductor layers 63 arranged in the X direction and between an area where the contacts CP are connected and an area where the contacts V1 are connected. The conductor layer 65 extends in the X direction and is provided above (at the other side in the Z direction with respect to) the insulator layer 64 (as illustrated).

The conductor layer 65 and the conductor layers 63 are adjacent to each other via the insulator layer 64. Accordingly, each of portions where the conductor layers 63 and the conductor layer 65 intersect functions as a lateral transistor TR. In this specification, the "lateral transistor" indicates a transistor whose channel direction is parallel to the surface of the semiconductor substrate.

That is, the conductor layer 63 is used as a current path (channel) of the transistor TR. The insulator layer 64 is used as a gate insulating film of the transistor TR. The conductor layer 65 is used as the transfer gate line TG shared by the plurality of transistors TR. Similarly, the lateral transistor TR is also connected to the select gate line SGS or the select gate line SGD via the contact CP.

Figure 16:
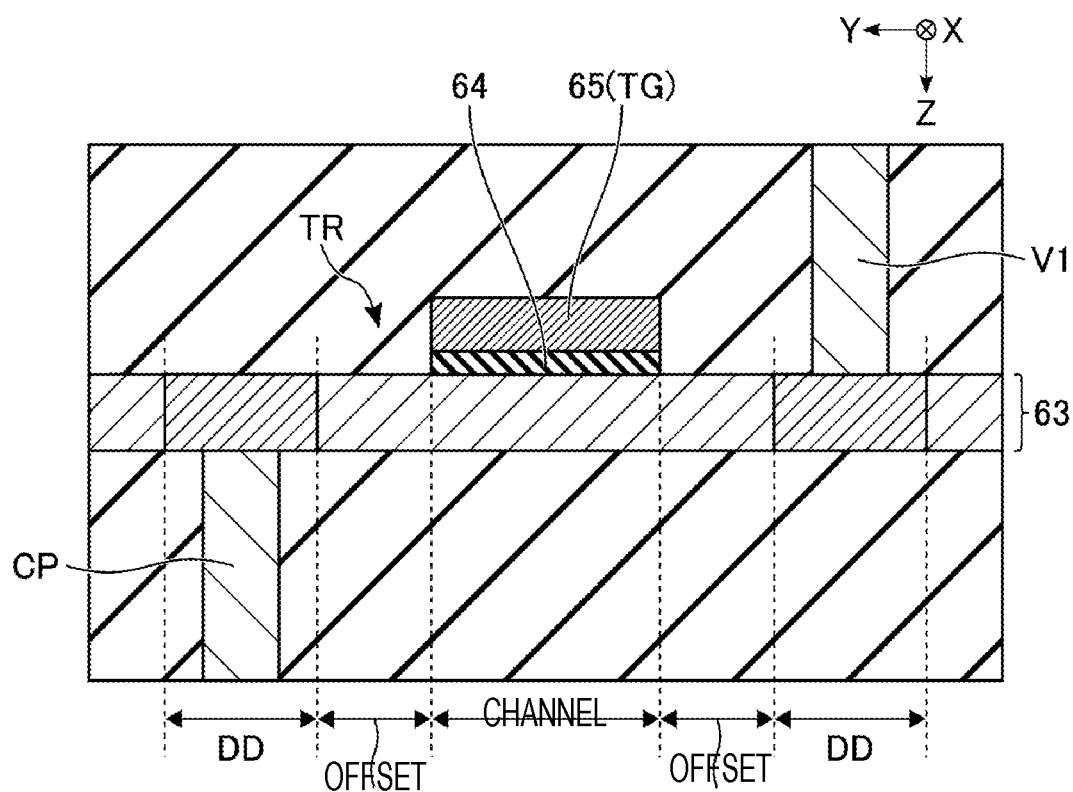
FIG. 16 is a cross-sectional view illustrating an example of a cross-sectional structure of a lateral transistor in the semiconductor memory device according to the second embodiment.

FIG. 16 illustrates an example of a cross-sectional structure of the transistor TR in the semiconductor memory device 1 according to the second embodiment. As illustrated in FIG. 16, the conductor layer 63 includes two high-concentration diffusion regions DD, a channel portion, and an offset portion.

In the conductor layer 63, the high-concentration diffusion regions DD are provided at a place where the contact CP is connected, and a place where the contact V1 is connected, respectively. The conductivity type of an impurity in doping of the high-concentration diffusion region DD is different from the conductivity type of an impurity in doping of the conductor layer 63. For example, the conductor layer 63 is a semiconductor layer doped with a P-type impurity, and the high-concentration diffusion region DD is doped with an N-type impurity. The channel portion faces the conductor layer 65. The offset portion is provided between the channel portion and the high-concentration diffusion region DD.

As described above, in the semiconductor memory device according to the second embodiment, the two high-concentration diffusion regions DD, the channel portion, the offset portion, the insulator layer 64 (the gate insulating film), and the conductor layer 65 (the transfer gate line TG) are appropriately arranged such that portions where the conductor layers 63 and the conductor layer 65 intersect function as the transistors TR. Other configurations of the semiconductor memory device 1 according to the second embodiment are the same as those in, for example, the first embodiment, and thus descriptions thereof will be omitted.

In the second embodiment, a case where the transistor TR is a single gate-type lateral transistor is given as an example, but the present disclosure is not limited thereto. For example, the transistor TR may be a double gate-type lateral transistor. In this case, in the semiconductor memory device 1, for example, a structure where the conductor layers 63 are interposed between two conductor layers 65 functioning as the transfer gate line TG in the Z direction is provided.

In the second embodiment, a case where the conductor layer 63 is used as the channel of the transistor TR, and the contact CP is connected from below (from the one side in the Z direction), whereas the contact V1 is connected from below (from the other side in the Z direction) is given as an example, but the present disclosure is not limited thereto. Each of the contacts CP and V1 may be connected to a predetermined area of the conductor layer 63 from any direction.

[2-2] Effect of Second Embodiment

As described above, in the semiconductor memory device according to the second embodiment, the transistor TR provided in the memory chip MC includes a lateral transistor. In this case as well, the semiconductor memory device 1 according to the second embodiment may operate in the same manner as in the first embodiment, and thus, the same effect as that in the first embodiment may be obtained. That is, according to the semiconductor memory device 1 according to the second embodiment, a chip area may be reduced, and thus the manufacturing cost of the semiconductor memory device 1 can be reduced.

[3] Third Embodiment

The semiconductor memory device 1 according to a third embodiment has a structure in which the transistor 30 provided in the CMOS chip CC in the first embodiment is provided in the memory chip MC. Hereinafter, descriptions will be made on the semiconductor memory device 1 according to the third embodiment, focusing on differences from the first and second embodiments.

[3-1] Structure in Memory Region MR and Sense Amplifier Region SR of Semiconductor Memory Device 1

Figure 17:
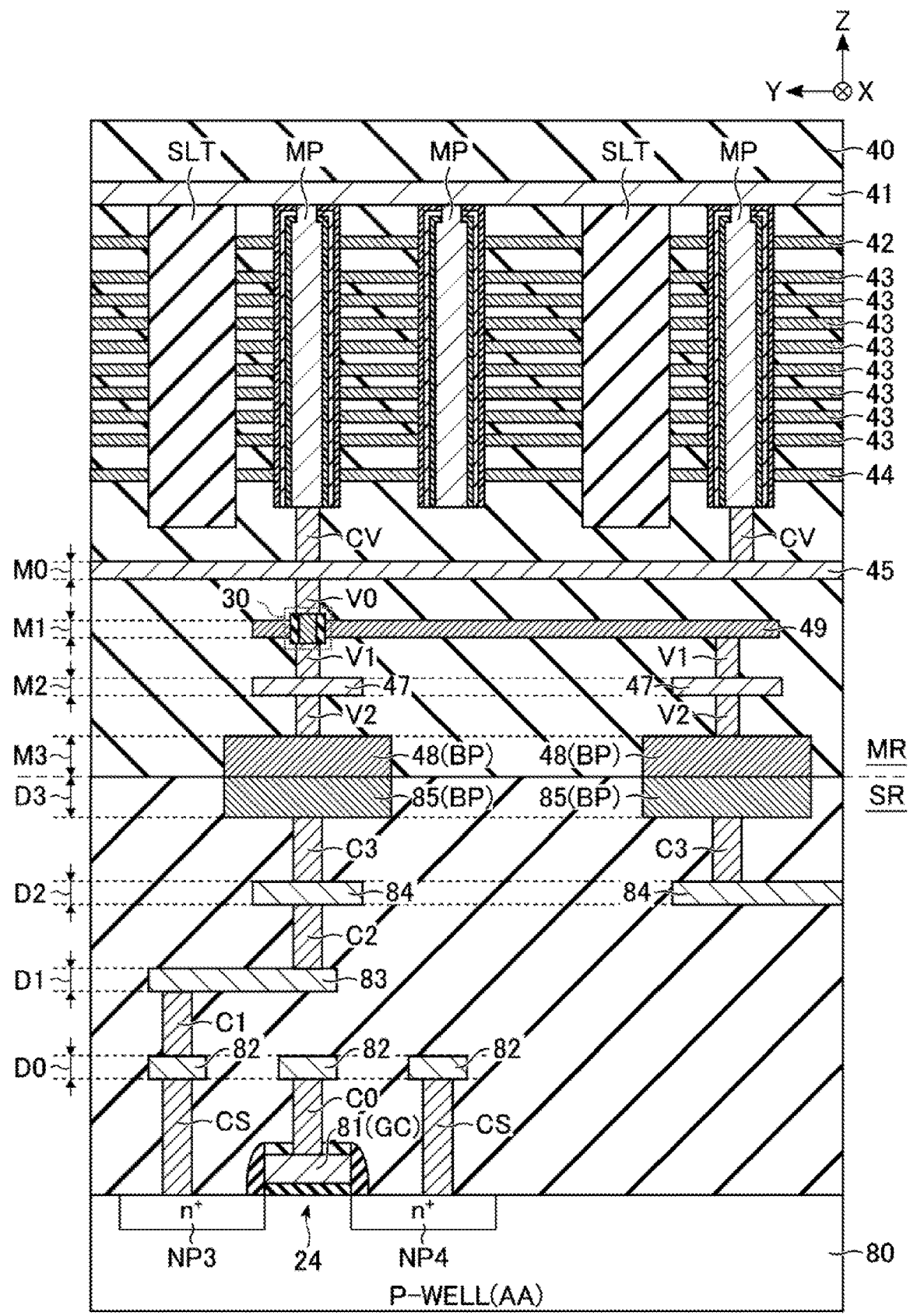
FIG. 17 is a cross-sectional view illustrating an example of a cross-sectional structure in a memory region and a sense amplifier region of a semiconductor memory device according to a third embodiment.

FIG. 17 illustrates an example of a cross-sectional structure in the memory region MR and the sense amplifier region SR of the semiconductor memory device 1 according to the third embodiment, and shows the same area as the one shown in FIG. 14. As illustrated in FIG. 17, the semiconductor memory device 1 according to the third embodiment has a structure in which, for example, the transistor 30 and a conductor layer 49 are added in the memory region MR.

The transistor 30 in the third embodiment is, for example, a vertical transistor provided between the contacts V0 and V1, and is capable of controlling current flowing between two contacts that are in contact with the upper surface and the lower surface of the transistor 30, respectively. For example, the transistor 30 has the same structure as the vertical transistor TR described in the first embodiment, and passes through the conductor layer 49.

The conductor layer 49 is provided in, for example, the wiring layer M1, and functions as a gate electrode of the transistor 30. The conductor layer 49 is connected to the conductor layer 48 (the bonding pad BP) via, for example, the contact V1, the conductor layer 47, and the contact V2.

The bonding pad BP connected to the conductor layer 49 is bonded to the bonding pad BP in the opposing sense amplifier region SR, and then is connected to the circuit in the sense amplifier region SR.

In the third embodiment, since the transistor 30 is provided in the memory region MR in the memory chip MC, in the area illustrated in FIG. 17, the transistor 24 is provided on the P-type well region 80. Other configurations of the semiconductor memory device 1 according to the third embodiment are the same as those in, for example, the first embodiment, and thus descriptions thereof will be omitted.

Further, in the third embodiment, a case where the transistor 30 is a vertical transistor is given as an example, but the transistor 30 may be a lateral transistor. When the transistor 30 includes a lateral transistor, the structure of the transistor 30 may be appropriately changed as described in the second embodiment.

[3-2] Effect of Third Embodiment

As described above, in the semiconductor memory device 1 according to the third embodiment, the transistor 30 in the sense amplifier unit SAU is provided in the memory chip MC. In this case as well, the semiconductor memory device 1 according to the third embodiment may operate in the same manner as in the first embodiment. In the semiconductor memory device 1 according to the third embodiment, the number of transistors disposed in the sense amplifier region SR is smaller as compared to that in the first embodiment.

As a result, in the semiconductor memory device 1 according to the third embodiment, an area of the sense amplifier region SR may be reduced, and a chip area of the CMOS chip CC may be reduced. Therefore, in the semiconductor memory device 1 according to the third embodiment, the chip area may be reduced as compared to that in the first embodiment, and then, the manufacturing cost of the semiconductor memory device 1 can be reduced.

[4] Fourth Embodiment

The semiconductor memory device 1 according to a fourth embodiment corresponds to a modification of the circuit configuration of the sense amplifier unit SAU in the first embodiment. Hereinafter, descriptions will be made on the semiconductor memory device 1 according to the fourth embodiment, focusing on differences from the first to third embodiments.

[4-1] Circuit Configuration of Sense Amplifier Module

Figure 18:
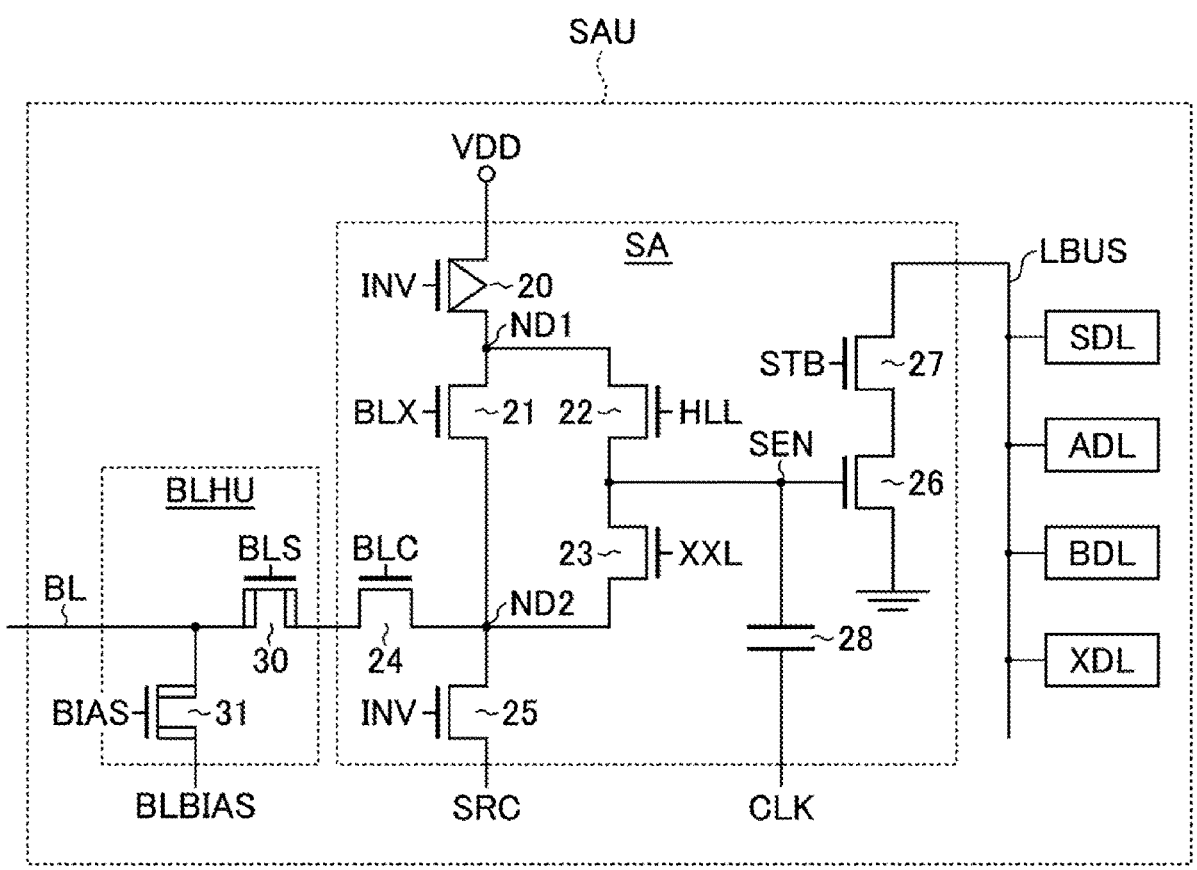
FIG. 18 is a circuit diagram illustrating an example of a circuit configuration of a sense amplifier unit in a semiconductor memory device according to a fourth embodiment.

FIG. 18 illustrates an example of a circuit configuration of the sense amplifier unit SAU in the semiconductor memory device 1 according to the fourth embodiment. As illustrated in FIG. 18, the sense amplifier unit SAU in the fourth embodiment has a configuration in which the bit line connector BLHU in the sense amplifier unit SAU in the first embodiment further includes a transistor 31.

The drain of the transistor 31 is connected to a node BLBIAS. The source of the transistor 31 is connected to the bit line BL. A control signal BIAS is input to the gate of the transistor 31. For example, an erase voltage VERA is applied to the node BLBIAS. The control signal BIAS is generated by, for example, the sequencer 13.

In addition, for example, like the transistor 30 in the third embodiment, the transistor 31 in the fourth embodiment is provided in the memory chip MC. Specifically, for example, a vertical transistor that corresponds to the transistor 31 and is provided in the memory chip MC is connected to the conductor layer 45 (the bit line BL) in FIG. 17 described in the third embodiment.

A configuration of the transistors 30 and 31 in the memory chip MC is not limited thereto, and may be appropriately changed. For example, in the fourth embodiment, the transistors 30 and 31 may be lateral transistors. A wiring connecting the transistors 30 and 31 to each other may be added to a wiring layer between the wiring layers M0 and M1. Other configurations of the semiconductor memory device 1 according to the fourth embodiment are the same as those in, for example, the first embodiment, and thus descriptions thereof will be omitted.

[4-2] Erase Operation of Semiconductor Memory Device 1

Hereinafter, an example of an erase operation of the semiconductor memory device 1 according to the first embodiment will be described. Hereinafter, voltages applied to various wirings will be appropriately described only with reference numerals. A block BLK that is a target of the erase operation is called a selected block BLK and a block BLK that is not a target of the erase operation is called a non-selected block BLK. Voltages applied to various wirings and nodes are generated by, for example, the driver module 15, and are applied via the row decoder module 16, etc.

Figure 19:
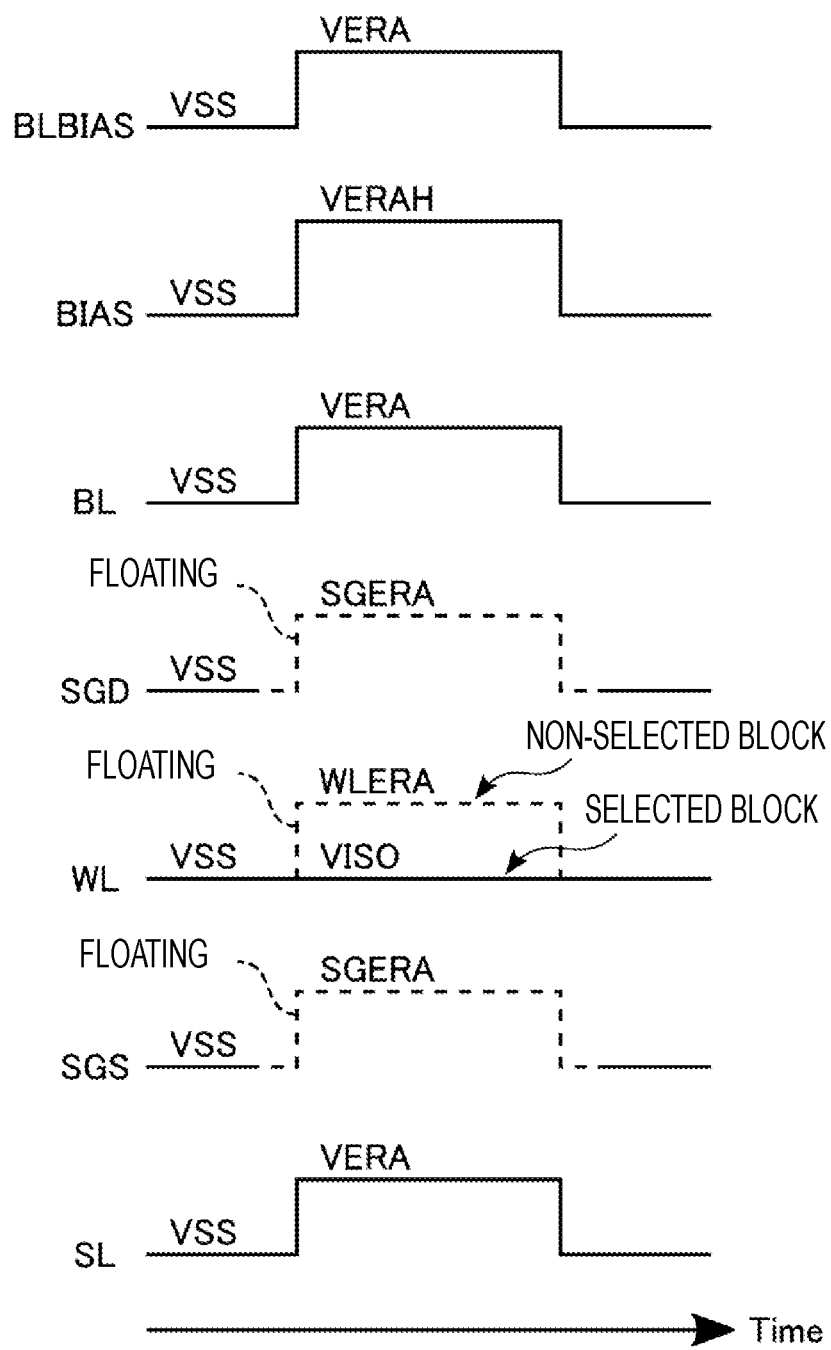
FIG. 19 is a timing chart illustrating an example of an erase operation in the semiconductor memory device according to the fourth embodiment.

FIG. 19 is a timing chart illustrating an example of an erase operation in the semiconductor memory device 1 according to the fourth embodiment. FIG. 19 illustrates an example of a voltage of each of the node BLBIAS, the control signal BIAS, the bit line BL, the select gate line SGD, the word line WL, the select gate line SGS, and the source line SL during the erase operation.

As illustrated in FIG. 19, before the erase operation, the voltage of each of the node BLBIAS, the control signal BIAS, the bit line BL, the select gate line SGD, the word line WL, the select gate line SGS, and the source line SL is, for example, the ground voltage VSS. When starting the erase operation, the sequencer 13 turns OFF the transistor 30 so that a current path between the bit line BL and the sense amplifier SA is cut off, and each of the select gate lines SGS and SGD, and the word line WL corresponding to the non-selected block BLK are placed in a floating state.

Then, the sequencer 13 increases the voltage of each of the node BLBIAS and the source line SL to the erase voltage VERA, increases the voltage of the control signal BIAS to VERAH, and maintains the voltage of the word line WL in the selected block BLK at VISO. VERA is higher than VSS, and is a high voltage used in the erase operation. VERAH is a voltage higher than VERA. VISO is a voltage lower than VERA, and is, for example, the same voltage as VSS.

The transistor 31 whose gate and drain are applied with VERAH and VERA, respectively, is turned ON, and the voltage of the node BLBIAS is transferred to the bit line BL. Then, the voltage of the bit line BL increases to VERA, and a high electric field region is formed below the memory pillar MP. Likewise, the voltage of the source line SL increases to VERA, and thus a high electric field region is formed above the memory pillar MP. Accordingly, in the vicinity of each of the select transistors ST1 and ST2, holes are generated by Gate-Induced-Drain-Leakage (GIDL), and the holes are injected to the channel in the memory pillar MP.

Further, as the voltages of the bit line BL and the source line SL increase to VERA, the voltage of the channel (the semiconductor layer 50) in the memory pillar MP increases. Then, as the voltage of the channel increases, the voltage of each of the select gate lines SGD and SGS, and the word line WL corresponding to the non-selected block BLK increases. For example, the voltage of each of the select gate lines SGD and SGS increases to SGERA, and the voltage of the word line WL corresponding to the non-selected block BLK increases to WLERA. SGERA and WLERA may be different from each other.

Meanwhile, since the word line WL corresponding to the selected block BLK is maintained at the voltage VISO, a voltage difference occurs between the control gate and the channel of the memory cell transistor MT. That is, a voltage gradient is formed between a high channel voltage and a low word line WL voltage. Then, the holes in the channel are injected to the charge storage layer (the insulating film 52), and recombination occurs between electrons held in the charge storage layer, and the injected holes on the basis of written data.

As a result, the threshold voltage of the memory cell transistor MT decreases, and data stored in the memory cell transistor MT is erased. Then, the sequencer 13 returns the voltages of various wirings to a state before the start of the erase operation. As described above, the semiconductor memory device 1 according to the fourth embodiment may erase data stored in the memory cell transistor MT.

[4-3] Effect of Fourth Embodiment

As described above, in the semiconductor memory device 1 according to the fourth embodiment, the transistors 30 and 31 in the sense amplifier unit SAU are provided in the memory chip MC. In this case as well, the semiconductor memory device 1 according to the fourth embodiment may operate in the same manner as in the first embodiment. Then, in the semiconductor memory device 1 according to the fourth embodiment, as in the third embodiment, an area of the sense amplifier region SR may be reduced, and a chip area of the CMOS chip CC may be reduced. Therefore, in the semiconductor memory device 1 according to the fourth embodiment, as in the third embodiment, the manufacturing cost of the semiconductor memory device 1 can be reduced.

[5] Fifth Embodiment

The semiconductor memory device 1 according to a fifth embodiment further includes a circuit capable of equalizing voltages of wirings connected to the memory cell array 10 unlike in the fourth embodiment. Hereinafter, descriptions will be made on the semiconductor memory device 1 according to the fifth embodiment, focusing on differences from the first to fourth embodiments.

[5-1] Circuit Configuration of Semiconductor Memory Device 1

Figure 20:
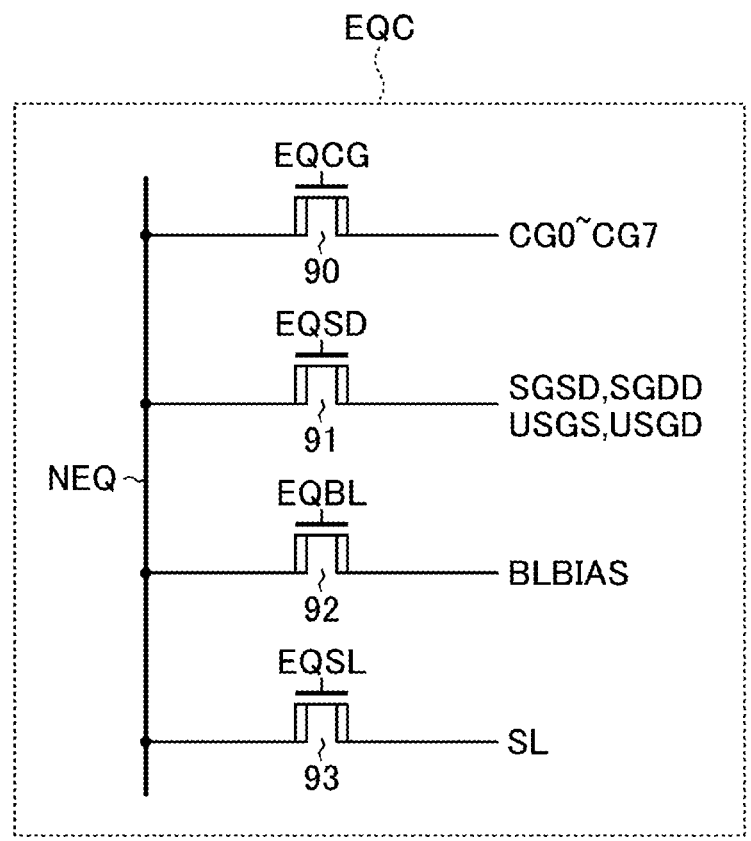
FIG. 20 is a circuit diagram illustrating an example of a circuit configuration of a semiconductor memory device according to a fifth embodiment.

FIG. 20 illustrates an example of a circuit configuration of the semiconductor memory device 1 according to the fifth embodiment. As illustrated in FIG. 20, the semiconductor memory device 1 according to the fifth embodiment includes an equalizing circuit EQC. The equalizing circuit EQC has a function of equalizing the voltages of wirings connected to the memory cell array 10. The equalizing circuit EQC includes, for example, transistors 90 to 93 and a node NEQ.

Each of the transistors 90 to 93 is an N-type MOS transistor with a high breakdown voltage. The drain of the transistor 90 is connected to the signal lines CG0 to CG7. The drain of the transistor 91 is connected to the signal lines SGSD, SGDD, USGS and USGD. The drain of the transistor is connected to the node BLBIAS. The drain of the transistor 93 is connected to the source line SL. Control signals EQCG, EQSD, EQBL, and EQSL are input to gates of the transistors 90 to 93, respectively. The source of each of the transistors 90 to 93 is connected to the node NEQ.

In addition, for example, like the transistor 30 in the third embodiment, each of the transistors 90 to 93 is provided in the memory chip MC. Specifically, each of the transistors 90 to 93 is provided in, for example, the pad region PR1. Each of the transistors 90 to 93 may be a vertical transistor, or a lateral transistor.

In the above-described circuit configuration of the equalizing circuit EQC, the control signals EQCG, EQSD, EQBL, and EQSL are generated by, for example, the sequencer 13. The signal lines CG0 to CG7, SGSD, SGDD, USGS, and USGD are connected to the node NEQ through high breakdown voltage transistors, and any number of transistors may be provided between various signal lines and the node NEQ in the design. Other configurations of the semiconductor memory device 1 according to the fifth embodiment are the same as those in, for example, the fourth embodiment, and thus descriptions thereof will be omitted.

[5-2] Effect of Fifth Embodiment

According to the above-described semiconductor memory device 1 according to the fifth embodiment, it is possible to speed up the operation of the semiconductor memory device. Hereinafter, details of the effect in the semiconductor memory device 1 according to the fifth embodiment will be described.

When completing a read operation, a write operation, etc., the semiconductor memory device returns voltages applied to various wirings to a state similar to an idle state. In such an operation completion processing, there is a possibility that an unintentional fluctuation may occur in the voltages of the various wirings due to an influence of coupling with adjacent wirings, etc. Hereinafter, an example of a voltage change at the time of an operation completion processing will be described by using a semiconductor memory device in which the equalizing circuit EQC is omitted, as a comparative example of the fifth embodiment.

Figure 21:
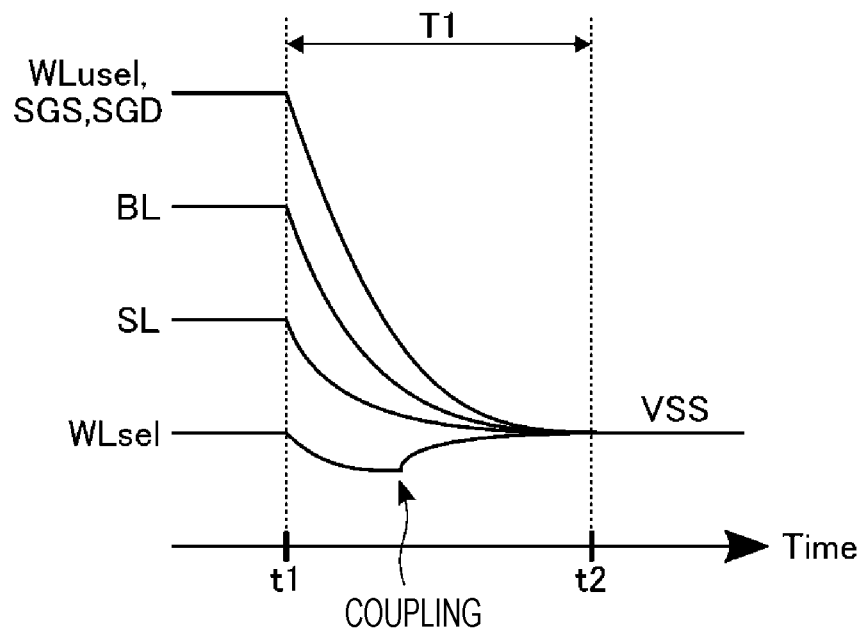
FIG. 21 is a timing chart illustrating an example of an operation completion processing in a semiconductor memory device according to a comparative example of the fifth embodiment.
Figure 22:
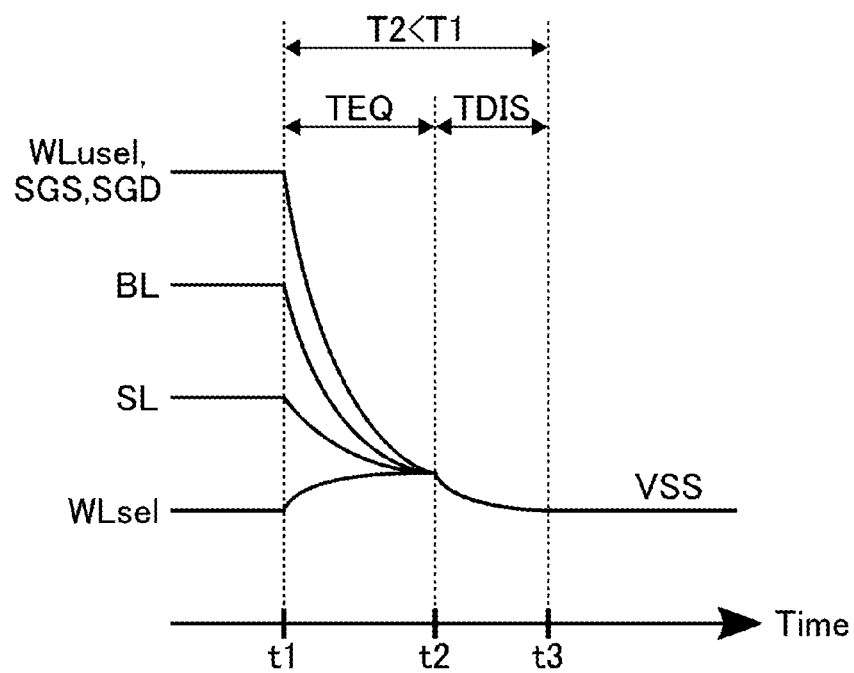
FIG. 22 is a timing chart illustrating an example of an operation completion processing in the semiconductor memory device according to the fifth embodiment.

FIG. 21 illustrates an example of a voltage change at the time of an operation completion processing in the comparative example of the fifth embodiment. FIG. 22 illustrates an example of a voltage change at the time of an operation completion processing in the fifth embodiment. Each of FIG. 21 and FIG. 22 illustrates the voltage of the selected word line WLsel, the voltage of the non-selected word line WLusel, the voltage of each of the select gate lines SGS and SGD, the voltage of the bit line BL, and the voltage of the source line SL. Examples of the voltages of various wirings at the time of start of the operation completion processing are enumerated as follows. The voltage of the selected word line WLsel is near the ground voltage VSS. The voltage of the source line SL is higher than the selected word line WLsel. The voltage of the bit line BL is higher than the voltage of the source line SL. The voltage of each of the non-selected word line WLusel and the select gate lines SGS and SGD is higher than the voltage of the bit line BL.

In the comparative example of the fifth embodiment, as illustrated in FIG. 21, when the operation completion processing starts at time t1, the voltage of each of the non-selected word line WLusel, the select gate lines SGS and SGD, the bit line BL, and the source line SL drops to the ground voltage VSS. Here, the voltage of the selected word line WLsel temporarily drops to a negative voltage due to an influence of coupling with other wirings. The voltage of the selected word line WLsel increases again to the ground voltage VSS when the influence of the coupling is reduced. The voltages of these wirings are placed in a state similar to an idle state at time t2. In FIG. 21, a time T1 from time t1 to time t2 corresponds to a time of the operation completion processing in the comparative example of the fifth embodiment.

Meanwhile, in the fifth embodiment, as illustrated in FIG. 22, when the operation completion processing starts at time t1, the sequencer 13 turns ON each of the transistors 90 to 93, and starts discharging of various wirings. Then, the voltage of each of the non-selected word line WLusel, the select gate lines SGS and SGD, the bit line BL, and the source line SL drops, and the voltage of the selected word line WLsel increases, and then these voltages become equal at time t2. Then, the sequencer 13 turns OFF, for example, each of the transistors 90 to 93, and performs discharging of the various wirings to the ground voltage VSS as in the comparative example of the fifth embodiment. In FIG. 22, a total time T2 which is the sum of a period TEQ from time t1 to time t2 during which the equalizing circuit EQC is operating, and a period TDIS from time t2 to time t3 when the various wirings are discharged to the ground voltage VSS corresponds to a time of the operation completion processing in the fifth embodiment, and is less than T1.

As described above, in the fifth embodiment, a voltage change caused by coupling occurring in the comparative example of the fifth embodiment is canceled by the equalizing circuit EQC. Thus, in the fifth embodiment, for example, a time until the voltage of the selected word line WLsel shifts to the ground voltage VSS is shorter than that in the comparative example of the fifth embodiment. Therefore, the semiconductor memory device 1 according to the fifth embodiment may shorten the time for the operation completion processing, and may speed up the operation.

In the fifth embodiment, a case in which the equalizing circuit EQC is added to the fourth embodiment is given as an example, but the equalizing circuit EQC may be added to other embodiments (e.g., the first embodiment). In this case, the equalizing circuit EQC may have, for example, a configuration in which the transistor 92 is omitted, and may operate in the same manner as described in FIG. 22.

[6] Sixth Embodiment

The semiconductor memory device 1 according to a sixth embodiment has a structure in which a part of circuits corresponding to the driver module 15 provided in the CMOS chip CC in the first embodiment is provided on the memory chip MC side. Hereinafter, descriptions will be made on the semiconductor memory device 1 according to the sixth embodiment, focusing on differences from the first to fifth embodiments.

[6-1] Circuit Configuration of Semiconductor Memory Device 1

Figure 23:
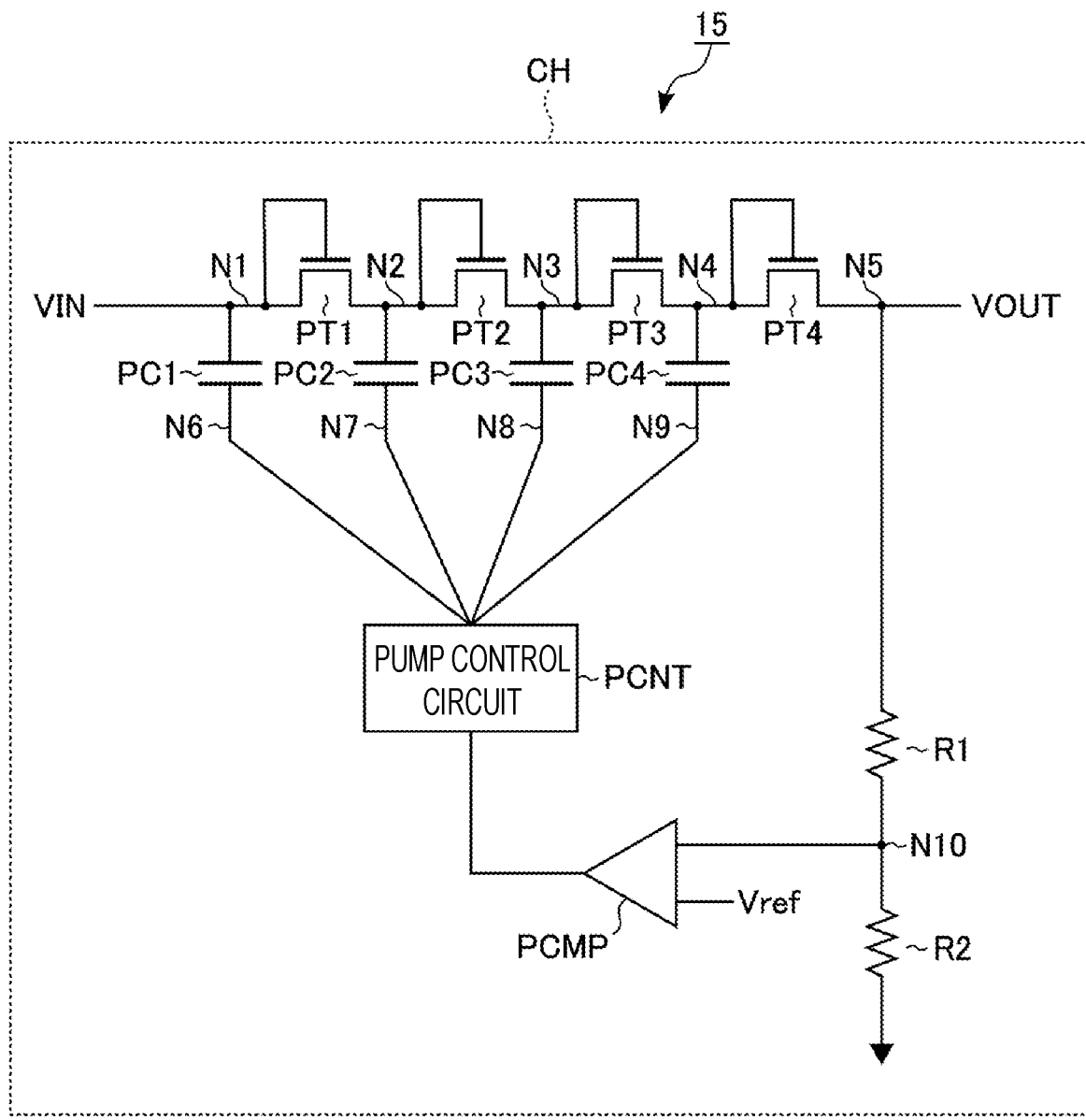
FIG. 23 is a circuit diagram illustrating an example of a circuit configuration of a driver module in a semiconductor memory device according to a sixth embodiment.

FIG. 23 illustrates an example of a circuit configuration of the driver module 15 in the semiconductor memory device 1 according to the sixth embodiment. As illustrated in FIG. 23, the driver module 15 in the sixth embodiment includes a charge pump CH. The charge pump CH has a function of boosting an input voltage VIN, and outputting a boosted voltage VOUT. The charge pump CH includes, for example, transistors PT1 to PT4, capacitors PC1 to PC4, resistor units R1 and R2, a comparator PCMP, a pump control circuit PCNT, and nodes N1 to N10.

Each of the transistors PT1 to PT4 is an N-type MOS transistor with a high breakdown voltage. The drain and the gate of the transistor PT1 are connected in common to the node N1. The drain and the gate of the transistor PT2 are connected in common to the node N2. The drain and the gate of the transistor PT3 are connected in common to the node N3. The drain and the gate of the transistor PT4 are connected in common to the node N4. Sources of the transistors PT1 to PT4 are connected to the nodes N2 to N5, respectively.

One side electrodes of the capacitors PC1 to PC4 are connected to the nodes N1 to N4, respectively. The other side electrodes of the capacitors PC1 to PC4 are connected to the nodes N6 to N9, respectively. The resistor unit R1 is connected between the nodes N5 and N10. The resistor unit R2 is connected between a ground line and the node N10. Thus, in the charge pump CH, the voltage of the node N10 changes according to the voltage VOUT.

The first input of the comparator PCMP is connected to the node N10. A reference voltage Vref is input to the second input of the comparator PCMP. A signal based on a comparison result between the voltage at the first input and the voltage at the second input in the comparator PCMP is output from the output of the comparator PCMP. The pump control circuit PCNT controls the voltages of the nodes N6 to N9 on the basis of the output signal of the comparator PCMP. For example, the pump control circuit PCNT indirectly detects the voltage of the voltage VOUT by using the comparator PCMP, so as to appropriately charge the capacitors PC1 to PC4. Accordingly, the charge pump CH may boost the input voltage to a desired voltage and output the voltage.

In addition, in the above-described circuit configuration of the charge pump CH, the numbers of transistors PT and capacitors PC are merely one example, and the present disclosure is not limited thereto. The number of transistors PT connected in series in the charge pump CH, and the number of capacitors PC connected to nodes between adjacent transistors may be appropriately changed according to a target value of the voltage to be boosted. The reference voltage Vref is appropriately changed according to a target value of VOUT.

[6-2] Structure in Pad Region PR1 of Semiconductor Memory Device 1

Figure 24:
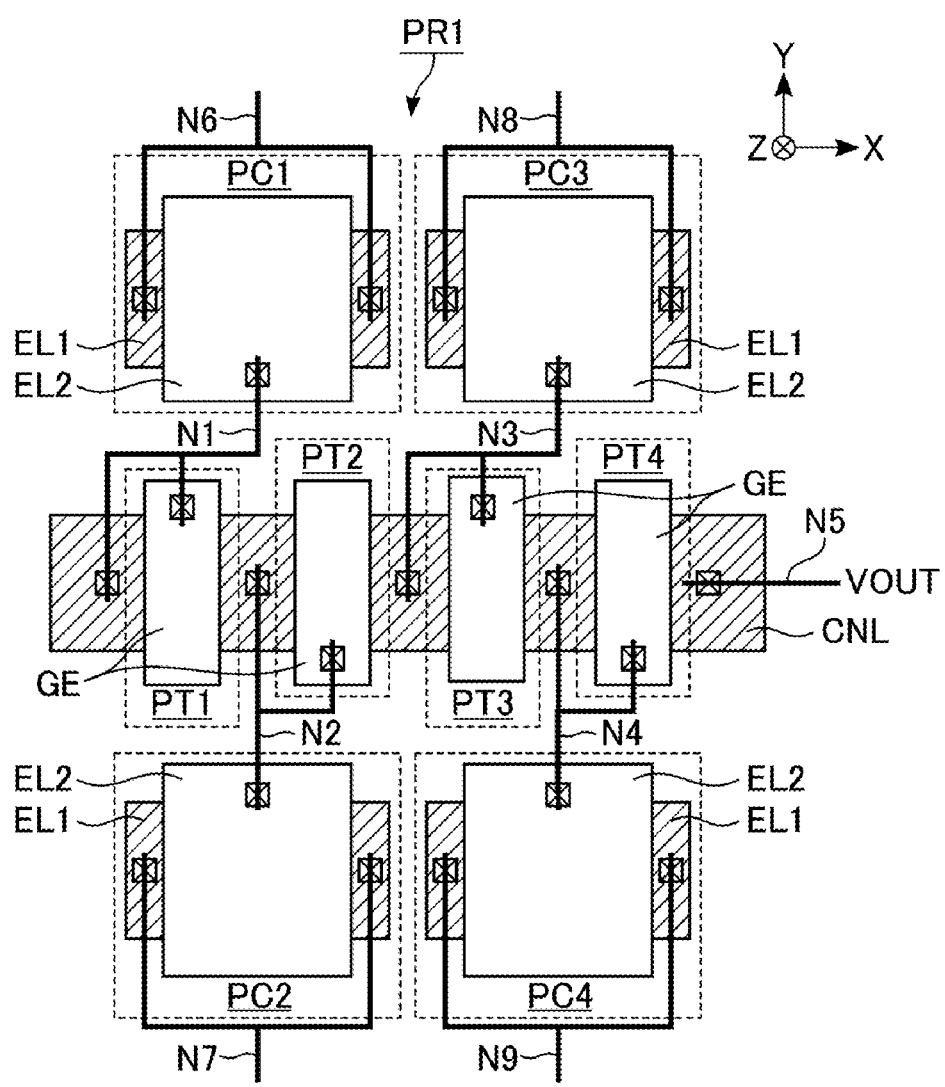
FIG. 24 is a plan view illustrating an example of a planar layout of a pad region in the semiconductor memory device according to the sixth embodiment.

FIG. 24 illustrates an example of the structure in the pad region PR1 of the semiconductor memory device 1 according to the sixth embodiment, in which an area corresponding to the charge pump CH is extracted. As illustrated in FIG. 24, in the pad region PR1, the semiconductor memory device 1 includes a channel portion CNL and a plurality of gate electrodes GE corresponding to a plurality of transistors PT, and includes a plurality of one side electrodes EL1 and a plurality of other side electrodes EL2 corresponding to a plurality of capacitors PC.

The channel portion CNL is, for example, a semiconductor layer extending in the X direction. The plurality of gate electrodes GE is arranged in the X direction, in which, for example, each of the gate electrodes GE extends in the Y direction and cross over the channel portion CNL. Portions where the four gate electrodes GE cross over the channel portion CNL function as the transistors PT1 to PT4, respectively.

Each of one side electrode EL1 and the other side electrode EL2 is, for example, a semiconductor layer provided in a plate shape. For example, two one side electrodes EL1 and two other side electrodes EL2 are provided on each of two sides of the channel portion CNL in the Y direction. In this example, four one side electrodes EL1 overlap with four other side electrodes EL2, respectively. Four sets of one side electrodes EL1 and the other side electrodes EL2 overlapping with each other function as the capacitors PC1 to PC4, respectively.

The above-described components of the charge pump CH are connected like the nodes N1 to N4 and N6 to N9 illustrated in FIG. 24. Accordingly, the voltage VOUT boosted by the charge pump CH is output via a contact connected to the end portion of the channel portion CNL.

Figure 25:
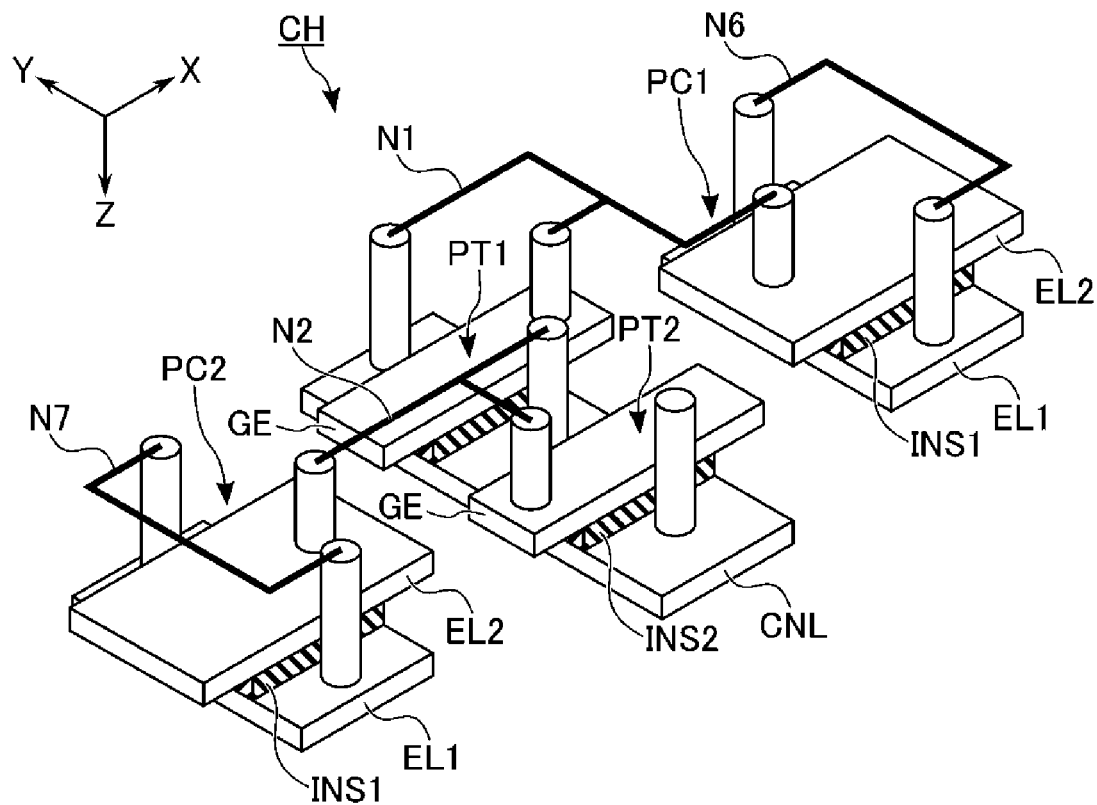
FIG. 25 is a perspective view illustrating an example of the structure of a charge pump in the semiconductor memory device according to the sixth embodiment.

FIG. 25 is a perspective view illustrating an example of the structure of the charge pump CH of the semiconductor memory device 1 according to the sixth embodiment, in which a structure corresponding to the transistors PT1 and PT2 and the capacitors PC1 and PC2 is extracted. As illustrated in FIG. 25, the semiconductor memory device 1 further includes insulator layers INS1 and INS2 in an area where the charge pump CH is formed.

The insulator layer INS1 is provided between one side electrode EL1 and the other side electrode EL2 of each capacitor PC. That is, a section of the capacitor PC has a structure similar to that of a normally-ON transistor. The insulator layer INS2 is provided between the channel portion CNL and the gate electrode GE. That is, the insulator layer INS2 is used as a gate insulating film of each of the transistors PT. A columnar contact is appropriately provided on each of the channel portion CNL and the gate electrode GE of each transistor PT. Likewise, a columnar contact is appropriately provided on each of one side electrode EL1 and the other side electrode EL2 of each capacitor PC. For example, upper surfaces of these contacts are aligned, and are appropriately electrically connected as described in FIG. 24. Other configurations of the semiconductor memory device 1 according to the sixth embodiment are the same as those in, for example, the first embodiment, and thus descriptions thereof will be omitted.

In addition, the structure of the charge pump CH is not limited to that described above. For example, the number of contacts connected to each transistor PT or each capacitor PC may be any number specified by the design. In addition, the transistor PT may be a vertical transistor, and the capacitor PC may be a vertical capacitor.

In addition, so long as the semiconductor memory device 1 according to the sixth embodiment has the same structure as that shown in FIG. 24, the structures and arrangement of the transistors PT and the capacitors PC may be appropriately changed. For example, all circuits corresponding to the charge pump CH may be provided in the memory chip MC, and the pump control circuit PCNT and the comparator PCMP may be provided in the CMOS chip CC. In the sixth embodiment, it is desirable that an element corresponding to a high breakdown voltage transistor in the charge pump CH is provided on the memory chip MC side.

[6-3] Effect of Sixth Embodiment

As described above, in the semiconductor memory device 1 according to the sixth embodiment, the charge pump CH in the driver module 15 is provided on the memory chip MC side. In this case, in the semiconductor memory device 1 according to the sixth embodiment, since circuits corresponding to the charge pump CH may be omitted from the CMOS chip CC, a chip area of the CMOS chip CC may be reduced. That is, according to the semiconductor memory device 1 according to the sixth embodiment, a chip area may be reduced, and thus the manufacturing cost of the semiconductor memory device 1 can be reduced.

In addition, in the semiconductor memory device 1 according to the sixth embodiment, the charge pump CH is provided on the memory chip MC side, and thus is not affected by a back bias effect. Thus, the charge pump CH in the sixth embodiment may reduce the number of transistors PT and capacitors PC, that is, the number of pump stages. As a result, the semiconductor memory device 1 according to the sixth embodiment may reduce current consumption, thereby reducing power consumption.

[7] Seventh Embodiment

The semiconductor memory device 1 according to the seventh embodiment corresponds to a specific example of a case where the memory chip MC has a plurality of memory cell arrays 10. Hereinafter, descriptions will be made on the semiconductor memory device 1 according to the seventh embodiment, focusing on differences from the first to sixth embodiments.

[7-1] Configuration of Semiconductor Memory Device 1

Figure 26:
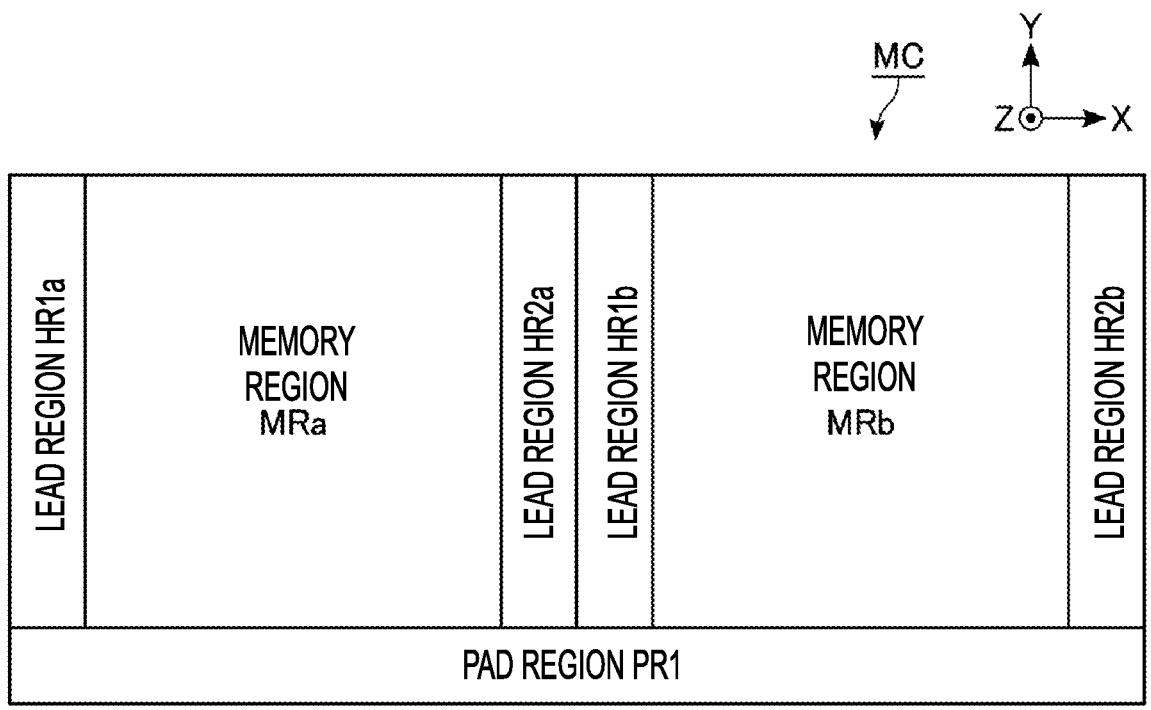
FIG. 26 is a plan view illustrating an example of a planar layout of a memory chip in a semiconductor memory device according to a seventh embodiment.

FIG. 26 illustrates an example of a planar layout in the memory chip MC of the semiconductor memory device 1 according to the seventh embodiment. As illustrated in FIG. 26, in the seventh embodiment, the memory chip MC includes memory regions MRa and MRb, lead regions HR1a and HR2a, lead regions HR1b and HR2b, and a pad region.

Each of the memory regions MRa and MRb has a structure similar to that of the memory region MR described in the first embodiment. Each of the lead regions HR1a and HR1b has a structure similar to that of the lead region HR1 described in the first embodiment, and the memory region MRa is interposed between the lead regions HR1a and HR1b. Each of the lead regions HR2a and HR2b has a structure similar to that of the lead region HR2 described in the first embodiment, and the memory region MRb is interposed between the lead regions HR2a and HR2b.

A set of the memory region MRa and the lead regions HR1a and HR2a, and a set of the memory region MRb and the lead regions HR1b and HR2b are adjacent to each other, for example, in the X direction. The pad region PR1 is adjacent to, for example, each of the memory regions MRa and MRb, in the Y direction. Although not illustrated, on the CMOS chip CC, the sense amplifier region SR, the peripheral circuit region PERI, and the transfer region XR are appropriately disposed, corresponding to the memory regions MRa and MRb, the lead regions HR1a and HR2a, and the lead regions HR1b and HR2b.

Each of the memory regions MRa and MRb functions as the memory cell array 10. The memory cell array 10 corresponding to the memory region MRa is connected to circuits provided in the CMOS chip CC via bonding pads BP disposed on the memory region MRa, or bonding pads BP disposed on the lead regions HR1a and HR2a. The memory cell array 10 corresponding to the memory region MRb is connected to circuits provided in the CMOS chip CC via bonding pads BP disposed on the memory region MRb, or bonding pads BP disposed on the lead regions HR1b and HR2b.

In the semiconductor memory device 1 according to the seventh embodiment, the sequencer 13 may independently control the memory cell array 10 in the memory region MRa and the memory cell array 10 in the memory region MRb. In this manner, a set of the memory cell array 10 and related circuits provided in different regions is called, for example, a plane. Other configurations of the semiconductor memory device 1 according to the seventh embodiment are the same as those in, for example, the first embodiment, and thus descriptions thereof will be omitted.

[7-2] Effect of Seventh Embodiment

As described above, the semiconductor memory device 1 according to the seventh embodiment includes a plurality of planes. In the semiconductor memory device 1 including the plurality of planes, in some cases, for example, circuits shared between planes or circuits used for communication between planes may be provided. Hereinafter, details of the effect of the seventh embodiment will be described by using a case where all elements corresponding to the row decoder module 16 are provided on the CMOS chip CC, as a comparative example of the seventh embodiment.

FIG. 27 illustrates an image of wirings between planes in each of the seventh embodiment and the comparative example of the seventh embodiment. As illustrated in FIG. 27, the number of bonding pads BP in the lead regions HR differs between the seventh embodiment and the comparative example of the seventh embodiment. Specifically, the number of bonding pads BP in the lead regions HR in the seventh embodiment is smaller than that in the comparative example of the seventh embodiment.

Wirings used for communication between planes need to pass through the lead regions HR arranged in a portion between adjacent planes. As in the comparative example of the seventh embodiment, when the number of bonding pads BP in the lead regions HR increases, the layout of the wirings used for communication between the planes becomes difficult. Meanwhile, in the seventh embodiment, since the number of bonding pads BP in the lead regions HR is small, the degree of freedom of the layout of the wirings used for communication between the planes increases.

That is, the semiconductor memory device 1 according to the seventh embodiment may lower the difficulty of the design in a wiring layout used for communication between planes. Therefore, even when the semiconductor memory device 1 includes a plurality of planes as in the seventh embodiment, it is possible to reduce the manufacturing cost by applying the configuration of the transistors TR in the first embodiment.

[8] Other Modifications, Etc.

A semiconductor memory device according to the embodiment includes a memory chip including a first region, a second region, a plurality of first word lines, a first pillar, a first bonding metal, and a first transistor. The first region includes a plurality of memory cells. The second region is different from the first region. The plurality of first word lines is stacked apart from each other in a first direction in the first region and the second region. The first pillar includes a first semiconductor layer provided through the plurality of first word lines, and a first insulator layer provided between the first semiconductor layer and the plurality of first word lines, in the first region. Portions where the plurality of first word lines and the first semiconductor layer intersect function as memory cells, respectively. The first bonding metal is provided in the second region. The first transistor is provided in a first layer between the plurality of first word lines and the first bonding metal, and is electrically connected between one first word line and the first bonding metal, in the second region. Accordingly, it is possible to reduce a chip area of the semiconductor memory device, and to reduce the manufacturing cost.

The above embodiments may be combined. For example, as a high breakdown voltage transistor provided in the memory chip MC, both a vertical transistor and a lateral transistor may be used. Both the charge pump CH and the equalizing circuit EQC may be provided on the memory chip MC side.

A design rule reduction for high breakdown voltage transistors used in the semiconductor memory device is difficult as compared to that for low breakdown voltage transistors. Thus, when the memory chip MC with a small capacity or the memory chip MC including a plurality of planes is manufactured, there is a concern that a chip area of the CMOS chip CC including high breakdown voltage transistors may become larger than that of the memory chip MC.

In contrast, in the semiconductor memory device 1 according to a combination of the above embodiments, all high breakdown voltage transistors may be provided on the memory chip MC side. In this case, since all transistors in the CMOS chip CC may include low breakdown voltage transistors, it is possible to reduce a chip area of the CMOS chip CC and to lower the process difficulty.

In the above embodiments, descriptions are made for a case where the memory pillar MP and the conductor layer 45 are connected via one contact CV, but the present disclosure is not limited thereto. The contact CV may be composed of two or more contacts connected in the Z direction. The same also applies to other contacts. When a plurality of contacts is connected in the X direction, different conductor layers may be inserted between adjacent contacts. Contacts and wiring layers may be appropriately added or omitted according to the circuit configuration of the semiconductor memory device 1.

In the above embodiments, descriptions are made on a case where a structure between two adjacent slits SLT corresponds to one string unit SU, but the present disclosure is not limited thereto. For example, a slit that divides the select gate line SGD may be provided between the two adjacent slits SLT so that a plurality of string units SU may be formed between the two adjacent slits SLT. The number of string units SU between the adjacent slits SLT changes on the basis of the number of slits that divide the select gate line SGD.

In the above embodiments, the memory pillar MP may have a structure in which a plurality of pillars (two or more) is connected in the Z direction. The memory pillar MP may have a structure in which a pillar corresponding to the select gate line SGD, and a pillar corresponding to the word lines WL are connected. The number of bit lines BL that are above each memory pillar MP may be any number specified by the design.

In the above embodiments, each of the memory pillar MP and the contacts CP, CV, V0, V1 and V2 may have a tapered shape or an inversely tapered shape, or may have a shape in which a middle portion is swollen. Likewise, the slit SLT may have a tapered shape or an inversely tapered shape, or may have a shape in which a middle portion is swollen. Descriptions are made on a case where the cross-sectional structure of the memory pillar MP or the transistor TR is circular, but this cross-sectional structure may be elliptical, or may be designed to have an arbitrary shape.

In the above embodiments, descriptions are made on a case where stacked wirings such as the word lines WL form a step structure having steps in the X direction in the lead region HR, but the present disclosure is not limited thereto. For example, steps may be formed in the end portions of the stacked word lines WL and select gate lines SGD and SGS, in the Y direction. The end portions of the stacked word lines WL and select gate lines SGD and SGS in the lead region HR may be designed to have a stepwise form having any number of columns. The formed step structure may vary among the select gate line SGS, the word lines WL, and the select gate line SGD.

In the descriptions herein, the "connection" indicates an electrical connection, and does not exclude, for example, a connection via another element. The terms "electrically connected" may include an electrical connection via an insulator as long as the same operation as that in the electrical connection may be performed. The "columnar" shape indicates a structure provided in a hole formed in the manufacturing process of the semiconductor memory device 1.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory chip, wherein the memory chip includes:
        a first region including a plurality of first memory cells and second memory cells;
        a second region different from the first region;
        a plurality of first word lines stacked apart from each other in a first direction in the first region and the second region;
        a first pillar including a first semiconductor layer extending through the plurality of first word lines, and a first insulator layer provided between the first semiconductor layer and the plurality of first word lines, in the first region, the first memory cells being located at intersections of the first pillar with the first word lines;
        a first bonding pad in the second region; and
        a first transistor between the plurality of first word lines and the first bonding pad, and connected between one of the first word lines and the first bonding pad, in the second region; and
    a circuit chip bonded to the memory chip, wherein the circuit chip includes:
        a substrate;
        a second bonding pad facing the first bonding pad of the memory chip; and
        a control circuit provided on the substrate, and electrically connected to the first transistor via the first bonding pad and the second bonding pad.

2. The semiconductor memory device according to claim 1, wherein the memory chip further includes:
    a plurality of second word lines in the first region and the second region, and stacked apart from each other in the first direction;
    a second pillar including a second semiconductor layer extending through the plurality of second word lines, and a second insulator layer provided between the second semiconductor layer and the plurality of second word lines, in the first region, the second memory cells being located at intersections of the second pillar with the second word lines; and
    a second transistor in the second region, connected between one of the second word lines and the first bonding pad, and having a gate that is electrically isolated from a gate of the first transistor.

3. The semiconductor memory device according to claim 2, wherein the memory chip further includes a second bonding pad electrically connected to the gate of the first transistor, and a third bonding pad electrically connected to a gate of the second transistor, in the second region.

4. The semiconductor memory device according to claim 3, wherein the first memory cells are in a first block of memory cells and second memory cells are in second block of memory cells.

5. The semiconductor memory device according to claim 4, wherein the first and second transistors are each a lateral transistor.

6. The semiconductor memory device according to claim 3, wherein the memory chip further includes a fourth bonding pad electrically connected to the first pillar, and a vertical transistor between the fourth bonding pad and the first pillar.

7. The semiconductor memory device according to claim 3, wherein the memory chip further includes a bit line connected to the first pillar and located between the first pillar and a surface of the memory chip on which the first, second, and third bonding pads are exposed.

8. The semiconductor memory device according to claim 1, wherein the first transistor is a vertical transistor.

9. A semiconductor memory device comprising:
    a memory chip, wherein the memory chip includes:
        a plurality of first memory cells and second memory cells;
        a plurality of first word lines stacked apart from each other in a first direction;
        a first pillar including a first semiconductor layer extending through the plurality of first word lines, and a first insulator layer provided between the first semiconductor layer and the plurality of first word lines, the first memory cells being located at intersections of the first pillar with the first word lines;
        a first bit line electrically connected to the first semiconductor layer;
        a first transistor electrically connected to the first bit line, wherein the first transistor is a vertical transistor; and
        a first bonding pad electrically connected to the first bit line via the first transistor; and
    a circuit chip bonded to the memory chip, wherein the circuit chip includes:
        a substrate;
        a second bonding pad facing the first bonding pad of the memory chip; and
        a control circuit provided on the substrate, and electrically connected to the first transistor via the first bonding pad and the second bonding pad.

10. The semiconductor memory device according to claim 9, wherein the memory chip further includes:
    a second pillar including a second semiconductor layer extending through the plurality of first word lines, and a second insulator layer provided between the second semiconductor layer and the plurality of first word lines, the second memory cells being located at intersections of the second pillar with the first word lines;
    a second bit line electrically connected to the second semiconductor layer;
    a second transistor electrically connected to the second bit line and having a gate electrically connected to a gate of the first transistor; and
    a second bonding pad electrically connected to the second bit line via the second transistor.

11. The semiconductor memory device according to claim 10, wherein the memory chip further includes a third bonding pad electrically connected to the gate of the first transistor and the gate of the second transistor.

12. The semiconductor memory device according to claim 11, wherein the first and second bit lines are located between the first and second pillars and a surface of the memory chip on which the first, second, and third bonding pads are exposed.

13. The semiconductor memory device according to claim 9, wherein the control circuit includes a second transistor having a lower breakdown voltage than the first transistor.

14. The semiconductor memory device according claim 13, wherein the second transistor is connected between the first transistor and the first bit line.

15. The semiconductor memory device according to claim 9, further comprising:
- a pump circuit configured to apply a high voltage to the first bit line via the first transistor.

16. The semiconductor memory device according to claim 15, wherein the memory chip further includes:
- a plurality of second transistors connected to the plurality of first word lines, respectively;
- signal lines respectively connected to the plurality of first word lines via the plurality of second transistors;
- a third transistor connected to one of the signal lines; and
- a fourth transistor connected between the first transistor and the third transistor.

17. The semiconductor memory device according to claim 15, wherein the first bit line is located between the first pillar and a surface of the memory chip on which the first bonding pad is exposed for bonding with the second bonding pad.

* * * * *